(12) United States Patent
Kim et al.

(10) Patent No.: US 8,946,892 B2
(45) Date of Patent: Feb. 3, 2015

(54) SEMICONDUCTOR PACKAGE

(75) Inventors: Yonghoon Kim, Suwon-si (KR); Jihyun Lee, Seoul (KR)

(73) Assignee: Samsung Electronics Co., Ltd., Yeongtong-gu, Suwon-si, Gyeonggi-do (KR)

( * ) Notice: Subject to any disclaimer, the term of this patent is extended or adjusted under 35 U.S.C. 154(b) by 273 days.

(21) Appl. No.: 13/274,176

(22) Filed: Oct. 14, 2011

(65) Prior Publication Data

US 2012/0139108 A1  Jun. 7, 2012

(30) Foreign Application Priority Data

Oct. 15, 2010  (KR) .................. 10-2010-0101030
Sep. 7, 2011  (KR) .................. 10-2011-0090546

(51) Int. Cl.
  H01L 23/053  (2006.01)
  H01L 23/48   (2006.01)
  H01L 23/52   (2006.01)
  H01L 29/40   (2006.01)
  H05K 1/16    (2006.01)
  H05K 1/11    (2006.01)
  H05K 7/00    (2006.01)
  H05K 1/14    (2006.01)
  H01L 23/498  (2006.01)
(Continued)

(52) U.S. Cl.
  CPC .......... H01L 23/49822 (2013.01); H01L 23/50 (2013.01); *H01L 24/48* (2013.01); *H01L 2224/48227* (2013.01); *H01L 2924/01012* (2013.01); *H01L 2924/15311* (2013.01); *H01L 2924/19105* (2013.01)
  USPC .......... 257/738; 257/701; 257/678; 257/773; 174/260; 174/261; 174/262; 174/263; 174/264; 174/265; 174/266; 361/760; 361/792; 361/793; 361/794; 361/795

(58) Field of Classification Search
  CPC .................................................... H01L 23/5223
  USPC .......... 257/701, 678, 773, 738; 174/260–266; 361/760, 792–795
  See application file for complete search history.

(56) References Cited

U.S. PATENT DOCUMENTS 6,384,476 B2  5/2002  Takeuchi
6,996,899 B2  2/2006  Searls et al.
(Continued)

FOREIGN PATENT DOCUMENTS

JP   2000-307005      11/2000
KR   10-2000-0071720 A  11/2000

*Primary Examiner* — David Zarneke
(74) *Attorney, Agent, or Firm* — Muir Patent Consulting, PLLC

(57) ABSTRACT

A semiconductor package includes a package substrate including a first wiring embedded in the package substrate, a second wiring embedded in the package substrate, the second wiring electrically insulated from the first wiring, and a capacitor embedded in the package substrate, the capacitor including a first electrode electrically connected to the first wiring and a second electrode electrically connected to the second wiring. At least a first semiconductor chip is disposed on the package substrate. A plurality of connection terminals are disposed between the package substrate and the first semiconductor chip and contact the package substrate, and form at least a first group of at least two connection terminals formed continuously adjacent to each other and electrically connected to the first wiring, and at least a second group of at least two connection terminals formed continuously adjacent to each other and electrically connected to the second wiring.

20 Claims, 35 Drawing Sheets

(51) Int. Cl.
*H01L 23/50* (2006.01)
*H01L 23/00* (2006.01)

(56) References Cited

U.S. PATENT DOCUMENTS

| | | | |
|---|---|---|---|
| 7,161,793 B2* | 1/2007 | Kurihara et al. | 361/306.3 |
| 7,405,921 B2* | 7/2008 | Kurihara et al. | 361/306.3 |
| 7,531,898 B2* | 5/2009 | Batchelor et al. | 257/737 |
| 7,856,710 B2* | 12/2010 | Kariya et al. | 29/852 |
| 7,982,139 B2* | 7/2011 | Kariya et al. | 174/260 |
| 8,823,183 B2* | 9/2014 | Kim et al. | 257/781 |
| 2004/0023450 A1* | 2/2004 | Katagiri et al. | 438/197 |
| 2005/0156221 A1* | 7/2005 | Kiyotoshi | 257/306 |
| 2006/0225916 A1 | 10/2006 | Nelson et al. | |
| 2006/0250749 A1* | 11/2006 | Kurihara et al. | 361/306.3 |
| 2007/0267720 A1* | 11/2007 | Toda et al. | 257/532 |
| 2009/0225525 A1* | 9/2009 | Mano et al. | 361/760 |
| 2009/0231820 A1* | 9/2009 | Tanaka | 361/764 |
| 2010/0200285 A1* | 8/2010 | Kariya et al. | 174/260 |
| 2011/0061921 A1* | 3/2011 | Tanaka | 174/260 |
| 2011/0259629 A1* | 10/2011 | Kariya et al. | 174/257 |
| 2011/0284282 A1* | 11/2011 | Ishida et al. | 174/266 |
| 2011/0284990 A1* | 11/2011 | Mahalingam et al. | 257/532 |
| 2012/0037414 A1* | 2/2012 | Tanaka | 174/260 |
| 2012/0139577 A1* | 6/2012 | Lee | 326/8 |
| 2013/0194714 A1* | 8/2013 | Nakaiso et al. | 361/301.2 |
| 2014/0001597 A1* | 1/2014 | Huang et al. | 257/531 |
| 2014/0017873 A1* | 1/2014 | Chang et al. | 438/396 |
| 2014/0035099 A1* | 2/2014 | Lehr | 257/532 |

* cited by examiner

SEMICONDUCTOR PACKAGE

CROSS-REFERENCE TO RELATED APPLICATIONS

This US non-provisional patent application claims priority under 35 USC §119 to Korean Patent Application Nos. 10-2010-0101030, filed on Oct. 15, 2010, and 10-2011-0090546, filed on Sep. 7, 2011, the entire contents of which are hereby incorporated by reference.

BACKGROUND

The embodiments described herein generally relate to semiconductor packages and, more specifically, to a semiconductor package including a flip chip.

A semiconductor package includes a semiconductor chip and a package substrate on which the semiconductor chip is mounted. Particularly, embedding technologies are being used to mount a capacitor in a package substrate. A ground voltage and a power supply voltage applied to a package substrate may be applied to two electrodes of an embedded capacitor, respectively. Connection patterns connecting the package substrate with a semiconductor pattern may be directly connected to the electrodes. Accordingly, there is a need for improving a structure of the connection patterns such that the capacitor is efficiently and precisely connected to the connection patterns.

SUMMARY

The disclosed embodiments provide a semiconductor package.

In one embodiment, the semiconductor package includes a package substrate, at least a first semiconductor chip disposed on the package substrate, and a plurality of connection terminals disposed between the package substrate and the first semiconductor chip. The package substrate includes a first wiring embedded in the package substrate, a second wiring embedded in the package substrate, the second wiring electrically insulated from the first wiring, and a capacitor embedded in the package substrate, the capacitor including a first electrode electrically connected to the first wiring and a second electrode electrically connected to the second wiring. The plurality of connection terminals contact the package substrate, and form at least a first group of at least two connection terminals formed continuously adjacent to each other and at least a second group of at least two connection terminals formed continuously adjacent to each other. The first group of at least two connection terminals is electrically connected to the first wiring and the second group of at least two connection terminals is electrically connected to the second wiring.

In one embodiment, a semiconductor package includes a package substrate, at least a first semiconductor chip disposed on the package substrate, and a plurality of connection terminals disposed between the package substrate and the first semiconductor chip. The package substrate includes a first wiring electrically connected to a first voltage source, a second wiring electrically connected to a second voltage source, the second wiring electrically insulated from the first wiring, and a capacitor including a first electrode electrically connected to the first wiring and a second electrode electrically connected to the second wiring. The plurality of connection terminals contact the package substrate, and form at least a first group of a plurality of connection terminals formed continuously adjacent to each other to form a first group structure, and at least a second group of a plurality of connection terminals formed continuously adjacent to each other to form a second group structure. The first group structure is electrically connected to the first wiring and first voltage source, and the second group structure is electrically connected to the second wiring and second voltage source. The first group structure includes at least four connection terminals, each connection terminal adjacent to at least one connection terminal of the first group structure in a first direction and also adjacent to at least a second connection terminal of the first group structure in a second direction not parallel to the first direction. The second group structure includes at least four connection terminals, each connection terminal adjacent to at least one connection terminal of the second group structure in a third direction and also adjacent to at least a second connection terminal of the second group structure in a fourth direction not parallel to the third direction.

In one embodiment, a semiconductor package includes a package substrate and at least a first semiconductor chip. The package substrate includes a first node electrically connected to a first voltage source, and a second node electrically connected to a second voltage source. The first node includes a first wiring, a first electrode of a capacitor electrically connected to the first wiring, a plurality of first via contacts electrically connected to the first wiring, and a plurality of first connection terminals electrically connected to the plurality of first via contacts, the plurality of first connection terminals physically separated from each other but respectively physically connected to the plurality of first via contacts. The second node includes a second wiring, a second electrode of a capacitor electrically connected to the second wiring, a plurality of second via contacts electrically connected to the second wiring, and a plurality of second connection terminals electrically connected to the plurality of second via contacts, the plurality of second connection terminals physically separated from each other but respectively physically connected to the plurality of second via contacts. The first node and the second node are electrically insulated from each other, and the first semiconductor chip is electrically connected to the package substrate through the plurality of first connection terminals and the plurality of second connection terminals.

BRIEF DESCRIPTION OF THE DRAWINGS

The disclosed embodiments will become more apparent in view of the attached drawings and accompanying detailed description. The embodiments depicted therein are provided by way of example, not by way of limitation, wherein like reference numerals refer to the same or similar elements. The drawings are not necessarily to scale, emphasis instead being placed upon illustrating aspects of the disclosed embodiments.

DETAILED DESCRIPTION

Figure 1A:
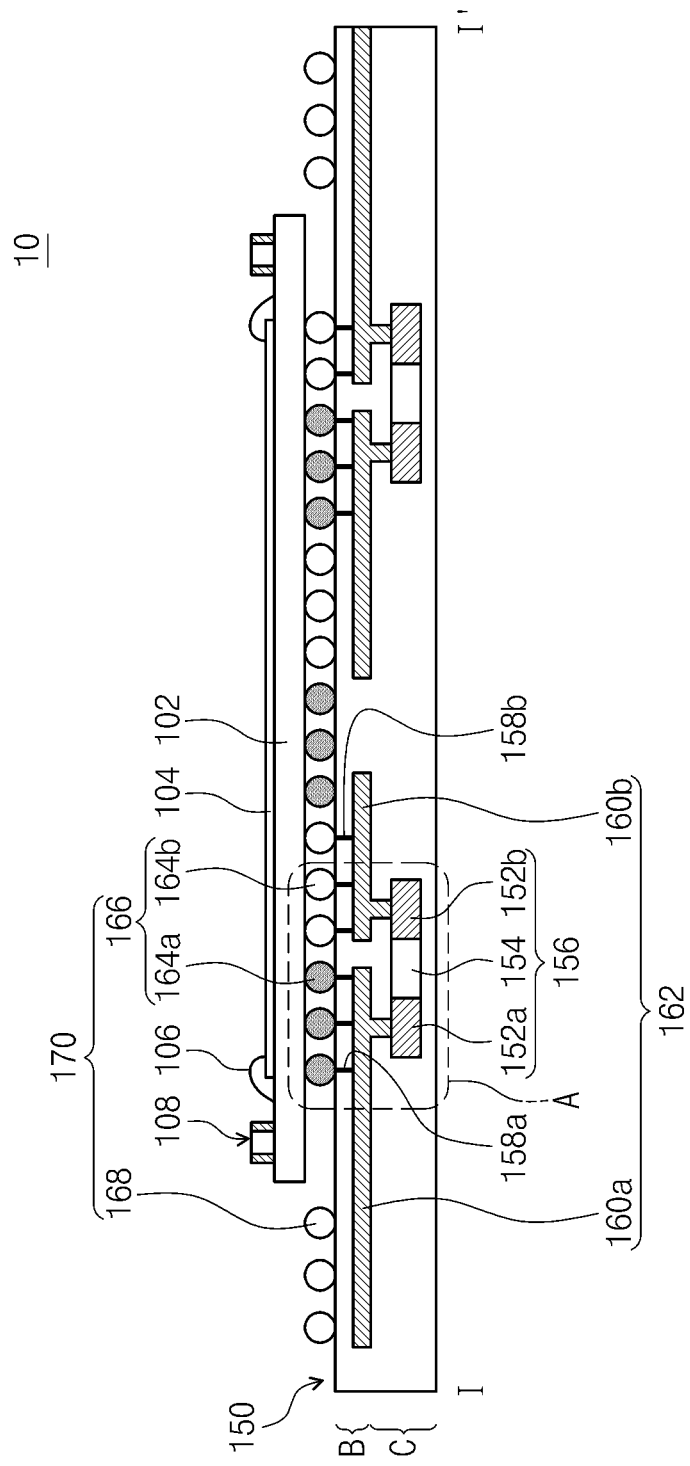
FIG. 1A is a cross-sectional view of a semiconductor package according to certain exemplary embodiments.

The advantages and features of the present disclosure and methods of achieving them will be apparent from the following exemplary embodiments that will be described in more detail with reference to the accompanying drawings. It should be noted, however, that the disclosed embodiments are not limited to the following examples, and may be implemented in various forms.

In the specification, it will be understood that when an element is referred to as being "connected," "coupled to," or "on" another layer or substrate, it can be directly connected to, coupled to, or on the other element, or intervening elements may also be present. In the drawings, thicknesses of elements are exaggerated for clarity of illustration.

Exemplary embodiments will be described below with reference to cross-sectional views, which are exemplary drawings. The exemplary drawings may be modified by manufacturing techniques and/or tolerances. Accordingly, the exemplary embodiments are not limited to specific configurations shown in the drawings, and may include modifications based on the method of manufacturing the semiconductor device. For example, an etched region shown at a right angle may be formed in a rounded shape or formed to have a predetermined curvature. Therefore, regions shown in the drawings have schematic characteristics. In addition, the shapes of the regions shown in the drawings exemplify specific shapes of regions in an element, and are not intended to limit the invention.

Though terms like a first, a second, and a third are used to describe various elements in various embodiments, the elements are not limited to these terms. Unless indicated otherwise, these terms are used only to tell one element from another element. An embodiment described and exemplified herein includes a complementary embodiment thereof. As used herein, the singular forms "a", "an" and "the" are intended to include the plural forms as well, unless the context clearly indicates otherwise.

Spatially relative terms, such as "beneath," "below," "lower," "above," "upper" and the like, may be used herein for ease of description to describe one element's or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the term "below" can encompass both an orientation of above and below. The device may be otherwise oriented (rotated 90 degrees or at other orientations) and the spatially relative descriptors used herein interpreted accordingly.

The terms used in the present specification are used to describe a particular embodiment and are not used to limit the present invention. As in the present specification, a singular form may include a plural form unless the singular form definitely indicates otherwise in the context. Also, in the present specification, the terms "include," "including," "comprise" and/or "comprising" specify existence of shapes, numbers, steps, operations, members, elements, and/or groups thereof, which are referred to, and do not exclude existence or addition of one or more different shapes, numbers, operations, members, elements, and/or groups thereof.

The various exemplary embodiments will now be described more fully hereinafter with reference to the accompanying drawings.

Figure 1B:
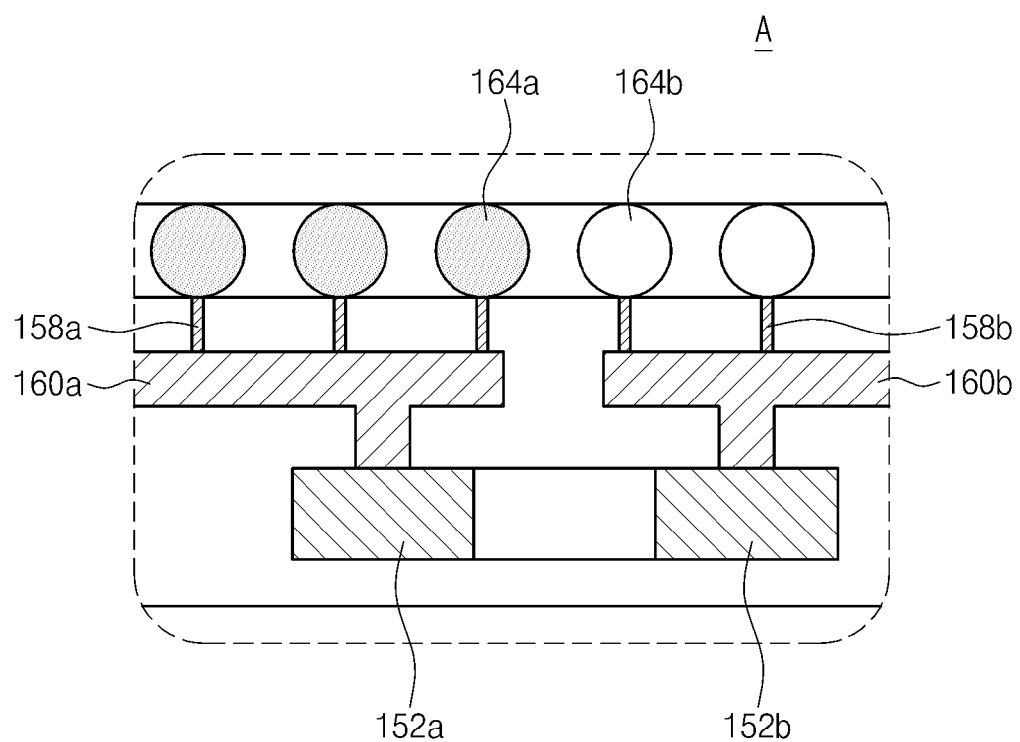
FIG. 1B is a partial enlarged view of the semiconductor package shown in FIG. 1A, according to certain exemplary embodiments.
Figure 1C:
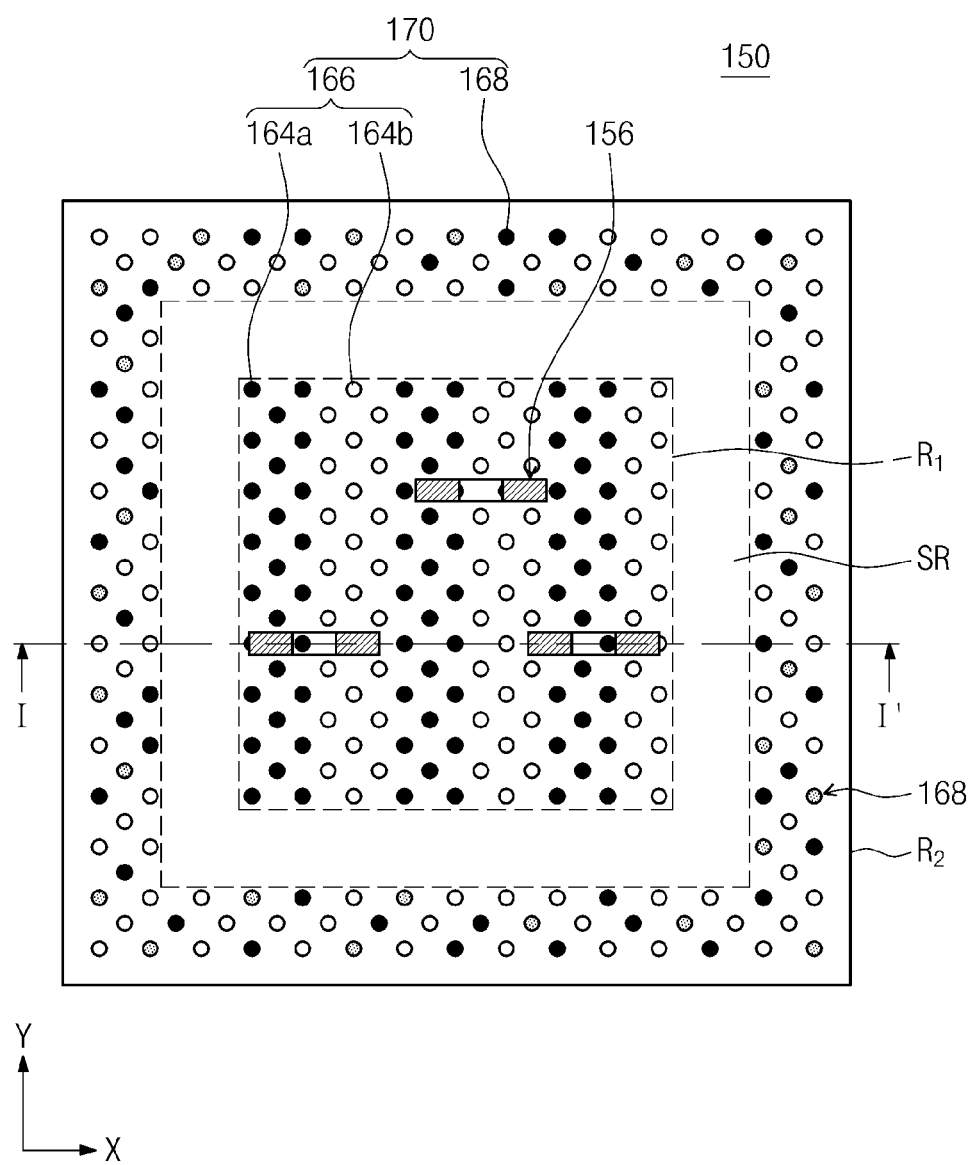
FIG. 1C is a top plan view of the semiconductor package shown in FIG. 1A, according to certain exemplary embodiments.

FIG. 1A is a cross-sectional view of a semiconductor package according to certain exemplary embodiments, FIG. 1B is a partial enlarged view of the semiconductor package shown in FIG. 1A, and FIG. 1C is a top plan view of the semiconductor package shown in FIG. 1A, according to an exemplary embodiment. FIG. 1A is a cross-sectional view taken along the line I-I' in FIG. 1C, and FIG. 1B is an enlarged view of an "A" portion of the semiconductor package shown in FIG. 1A.

Figure 1D:
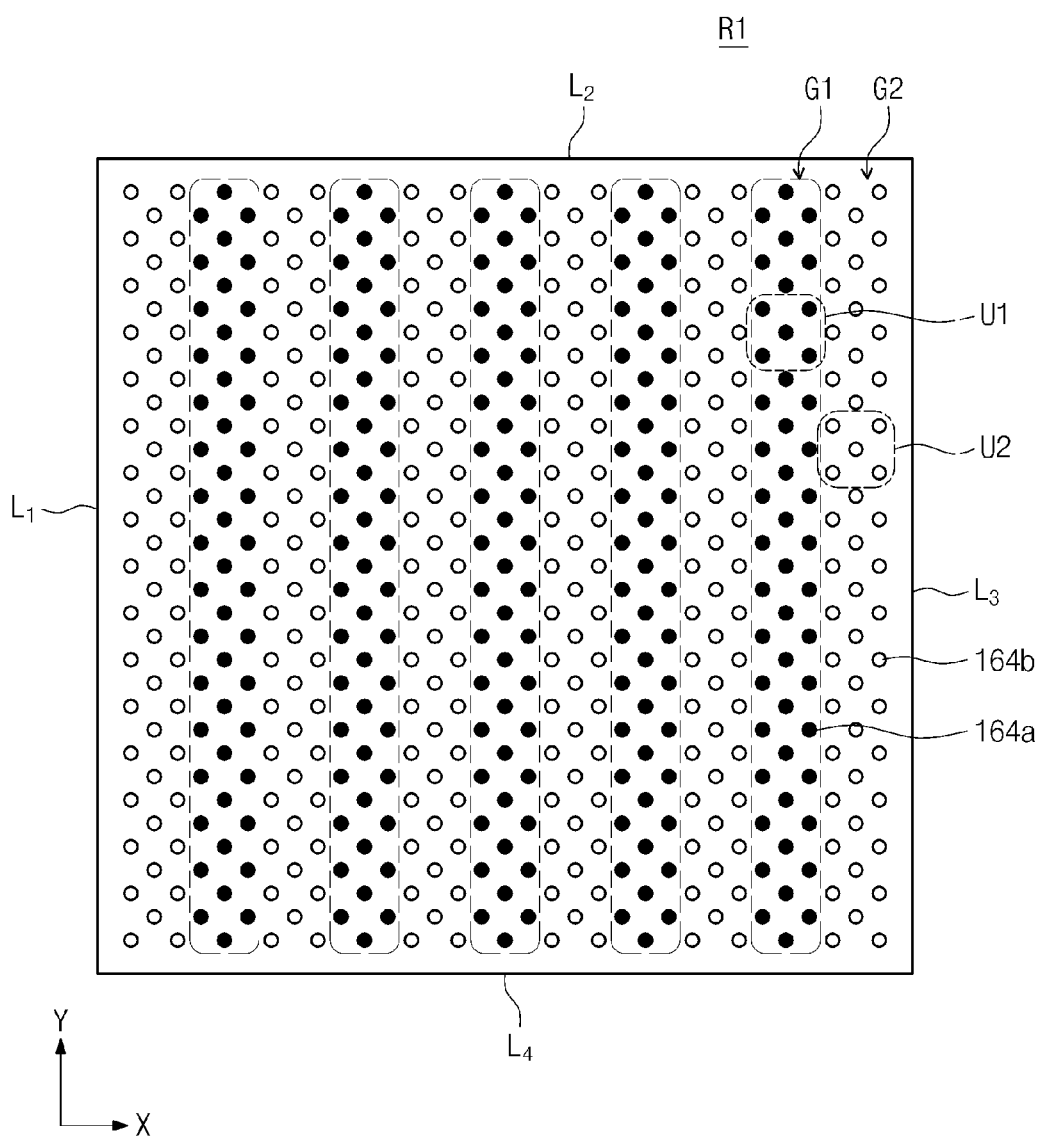
FIG. 1D is a top plan view illustrating an arrangement structure of first and second connection patterns of a semiconductor package according to one exemplary embodiment.
Figure 1E:
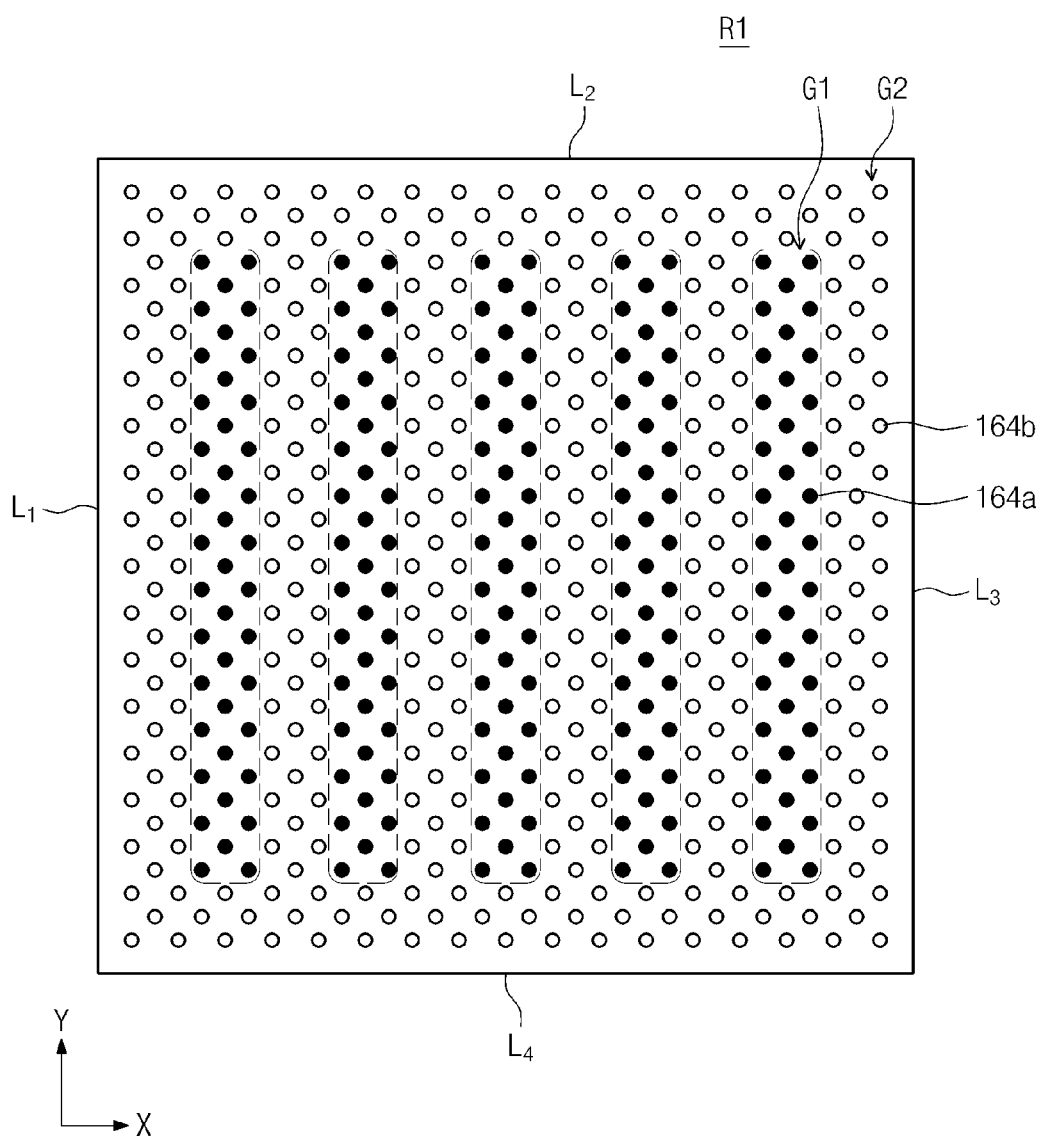
FIG. 1E is a top plan view illustrating an arrangement structure of first and second connection patterns of a semiconductor package according to another exemplary embodiment.

FIG. 1D is a top plan view illustrating an arrangement structure of first and second connection patterns of a semiconductor package according to one embodiment, and FIG. 1E is a top plan view illustrating an arrangement structure of first and second connection patterns of a semiconductor package according to another embodiment.

Referring to FIGS. 1A through 1C, a semiconductor package 10 may include a package substrate 150, an intermediate substrate 102, a semiconductor chip 104, and connection structures 170 electrically connecting the semiconductor chip 104 to the package substrate 150.

The semiconductor chip 104 may be disposed on a top surface of the intermediate substrate 102. In an example embodiment, the semiconductor chip 104 is disposed in a central portion of the intermediate substrate 102. In another example embodiment, the semiconductor chip 104 is disposed at an edge portion of the intermediate substrate 102. The semiconductor chip 104 and the intermediate substrate 102 may be electrically connected through a conductive terminal such as, for example, a bonding wire 106. Although a single semiconductor chip and intermediate substrate is shown, a plurality of stacked chips may be mounted on the intermediate substrate 102, using one or more chip stack technologies (e.g., wire bonding, through vias, etc.). The chips may be memory chips or logic chips. The chips may be the same sizes or different sizes, and may be stacked in different configurations (e.g., edge-aligned, step-wise alignment, mesa arrangement, spiral arrangement, zig-zag arrangement, etc.). In addition, or alternatively, a plurality of intermediate substrates may be connected to each other in a stack above package substrate 150, each including one or more stacked chips, to form a package having a package-on-package structure.

A first capacitor 108 may be disposed on the top surface of the intermediate substrate 102. According to certain embodiments, the first capacitor 108 is mounted on the top surface of the intermediate substrate 102 (surface mount technology; SMT). According to alternative embodiments, the first capacitor 108 may be embedded in the intermediate substrate 102. The intermediate substrate 102 may be, for example, a substrate that includes circuitry, through wires, and through vias for electrically connecting between the semiconductor chip 104 and the package substrate 150.

In one embodiment, the package substrate 150 includes a core portion C, a second capacitor 156 disposed within the core portion C, and buildup portions B disposed on a top surface and/or a rear surface of the core portion C. In FIG. 1A, it is exemplarily shown that the buildup portion B is disposed on the top surface of the core portion C.

Although not discussed in detail, the core portion C may include metal cores. An insulator may be disposed to fill a space between the metal cores. A second capacitor 156 may be disposed between the metal cores and electrically insulated from the metal cores by the insulator. For example, each of the metal cores may be made of stainless steel, aluminum, nickel, magnesium, zinc, tantalum or an alloy thereof. Circuit patterns 162 may be disposed in the buildup portions B, respectively. The circuit patterns 162 may be electrically connected to the metal cores. The circuit patterns 162 may be electrically connected to one another.

The second capacitor 156 may include a first electrode 152a, a second electrode 152b, and a dielectric film 154 disposed between the first and second electrodes 152a and 152b. The first and second electrodes 152a and 152b of the second capacitor 156 may be electrically connected to the circuit patterns 162 disposed in the buildup portion B, respectively. The circuit patterns 162 disposed in the buildup portion B may include a first wiring 160a connected to the first electrode 152a and a second wiring 160b connected to the second electrode 152b. The first wiring 160a and second wiring 160b may each be a conductive portion formed of a conductive material, and the first wiring 160a may be electrically separate from the second wiring 160b. The two wirings may be formed as a wiring pattern in the substrate, the wiring pattern including multiple separate wirings. As such, a first conductive portion (e.g., the first wiring 160a) of the circuit pattern 162 is electrically connected to the first electrode 152a, and a second conductive portion (e.g., the second wiring 160b) of the circuit pattern 162 is electrically connected to the second electrode 152b. Both the conductive portions and the electrodes may be positioned so that they are within the package substrate 150. For example, the conductive portions and electrodes may be disposed to have bottom surfaces that are raised above a bottom surface of the package substrate 150, and top surfaces that are disposed below a top surface the package substrate 150, such that they are entirely embedded in the package substrate 150.

In the package substrate 150, there may be at least one first via contact 158a electrically connected to the first wiring 160a and at least one second via contact 158b electrically connected to the second wiring 160b. The first and second via contacts 158a and 158b may electrically connect the internal connection patterns 166 with the first and second wirings 160a and 160b. The first and second via contacts 158a and 158b may be disposed vertically between the circuit patterns 162 and the internal connection patterns 166. This will be described in more detail below.

According to some embodiments, a first voltage may be applied to the first electrode 152a through the first wiring 160a, and a second voltage may be applied to the second electrode 152b through the second wiring 160b. The second voltage may be substantially different from the first voltage. For example, the first voltage may be a ground voltage, and the second voltage may be a power supply voltage applied to the package substrate 150.

Referring to FIGS. 1A through 1C, the top surface of the package substrate 150 may include a first region R1 in which the semiconductor chip 104 and the intermediate substrate 102 are disposed and a second region R2 formed to surround the first region R1. The top surface of the package substrate 150 may further include a separation region SR formed between the first and second regions R1 and R2. According to one embodiment, when the top surface of the package substrate 150 is viewed in plane, the first region R1 is disposed in a central portion to have a square shape, the separation region SR is disposed to surround the first region R1, and the second region R2 is disposed to surround the separation region SR.

The connection structures 170 may include internal connection patterns 166 (e.g., terminals, such as conductive balls or bumps) and external connection patterns 168 (e.g., terminals, such as conductive balls or bumps).

The internal connection patterns 166 may be disposed in the first region R1 of the package substrate 150. According to one embodiment, the internal connection patterns 166 electrically connect the package substrate 150 to the intermediate substrate 102 (e.g., by connecting to the embedded first or second wiring through the via contacts or other conductive contacts). According to one embodiment, the internal connection patterns 166 include nodes, such as balls or bumps, that directly connect to the package substrate 150 and to the intermediate substrate 102.

The external connection patterns 168 may be disposed in the second region R2 of the package substrate 150. In one embodiment, no connection terminals are included in separation region SR, so that the connection structure 170 is not disposed in the separation region SR.

According to some embodiments, the internal connection patterns 166 and the external connection patterns 168 may each include a plurality of terminals, or nodes, such as a plurality of solder bumps. For example, a plurality of solder bumps may be arranged and spaced at regular intervals in a Y-axis direction to constitute a string. Strings in the Y-axis direction may be arranged and spaced in an X-axis direction. Solder bumps arranged and spaced in the X-axis direction may be arranged zigzag. In the X-axis direction, a solder bump may be arranged at a space between two solder bumps arranged in the Y-axis direction to be adjacent to each other. For example, as shown in FIG. 1C, if the Y-axis is in the direction of a first edge of the package substrate 150 and the X-axis is in the direction of a second edge of the package substrate 150 perpendicular to the first edge, external connection terminals may be arranged in rows (or columns) in the Y-direction, wherein terminals in a first row are offset from terminals in an immediately adjacent second row such that a closest terminal in the first row to a given terminal in the second row is disposed diagonally from the given terminal with respect to the X and Y directions. However, this is only one exemplary embodiment, and other arrangements of the terminals may be used.

Exemplary arrangements of the internal connection patterns 166 will now be described below in detail.

The internal connection patterns 166 may include first and second connection patterns 164a and 164b (e.g., first and second sets, or groupings, of connection terminals). In one embodiment, the first connection pattern 164a is electrically connected to the first wiring 160a, and the second connection pattern 164b is electrically connected to the second wiring 160b. For example, in one embodiment, the first electrode 152a laterally covers the space of fewer than the total number of terminals in the first group of terminals 164a (e.g., it may vertically overlap only 1 or 2 terminals, or only a first and second row of terminals), but the first wiring 160a laterally covers the space (i.e. vertically overlaps) of all of the terminals in the first group of terminals 164a. Similarly, the second electrode 152b may laterally cover the space of fewer than the total number of terminals in the second group of terminals 164a (e.g., it may vertically overlap only 1 or 2 terminals, or only a first and second row of terminals), but the second wiring 160b may laterally cover the space (i.e. vertically overlap) all of the terminals in the second group of terminals 164b. The other electrodes shown but not labeled in FIG. 1C may include similar connections to terminals and wirings. As such, the capacitor electrodes can have a smaller size and cover a smaller area than the wirings and connection terminals, but can still electrically connect to all of the terminals in a group of terminals In some embodiments, the first connection pattern 164a may be electrically connected to the first via contacts 158a and may be electrically connected to the first wiring 160a via the first via contacts 158a. For example, in the case that a plurality of the first via contacts 158a are provided, each of the first via contacts 158a may be electrically connected to a corresponding terminal of the first connection pattern 164a. The second connection patterns 164b may be electrically connected to the second via contact 158b and may be electrically connected to the second wiring 160b via the second via contacts 158b. For example, in the case that a plurality of the second via contacts 158b are provided, each of the second via contacts 158b may be electrically connected to a corresponding terminal of the second connection pattern 164b. As such, the first connection pattern 164a, first via contacts 158a, and first electrode 152a may all be considered a first node, and the second connection pattern 164b, second via contacts 158b, and second electrode 152b may all be considered a second node. The via contacts may be, for example, small sized through vias partially passing through the package substrate 150, for example disposed the buildup portion B between the wirings 160a and 160b. Alternatively, the via contacts may be wires embedded in the buildup portion B of the package substrate. Each via contact may be separated and electrically insulated from other via contacts by, for example, an insulating material in the buildup portion B of the package substrate.

The first wiring 160a (and thus the first node) may be connected to a first voltage (e.g., ground voltage) to receive the applied first voltage, and the second wiring 160b (and thus the second node) may be connected to a second voltage (e.g., power supply voltage) to receive the applied second voltage, wherein the first and second voltages are applied to the package substrate 150.

Referring to FIG. 1D, the first connection pattern 164a may constitute a first group structure G1 (i.e., a first terminal group). The first group structure G1 may include a plurality of first unit structures U1 (i.e., first terminal sub-groups). At least one of the first unit structures U1 may include, for example, one of the terminals of first connection pattern 164a and another four terminals of the first connection pattern 164a arranged therearound. The four outer connection terminals may be arranged equidistant from the inner connection terminal disposed in the center, and may thus form an X shape with minimal spacing between terminals.

The second connection patterns 164b may constitute a second group structure G2 (i.e., a second terminal group). The second group structure G2 may be disposed in a region that is spatially separated from the first group structure G1. For example, the first group structure G1 and second group structure G2 may be arranged in separate regions that do not overlap in a particular direction (e.g., the X-direction). The second group structure G2 may include a plurality of second unit structures U2 (i.e., second terminal sub-groups). At least one of the second unit structures U2 may include, for example, one of the terminals of second connection pattern 164b and other four of the second connection terminals arranged therearound. The four outer connection terminals may be arranged equidistant from the inner connection terminal disposed in the center, and may thus form an X shape with minimal spacing between terminals. As such, in one embodiment, each of the first group structure and the second group structure includes at least four connection terminals, each connection terminal adjacent to at least one connection terminal of that group structure in a first direction and also adjacent to at least a second connection terminal of that group structure in a second direction not parallel to the first direction.

According to some embodiments, the first group structure G1 may have a linear shape extending in the Y-axis direction. The second group structure G2 may also have a linear shape extending in the Y-axis direction. A plurality of first group structures G1 and a plurality of second group structures G2 may be provided, respectively, and may be arranged in an alternating manner. The first group structure G1 may be connected, for example, to a first voltage through a conductive portion (e.g., wiring), and the second group structures G2 may be connected, for example, to a second voltage through a second conductive portion (e.g., wiring). In one embodiment, each of the separate first group structures G1 connects separately from the other first group structures G1 to the first voltage (i.e., a power voltage source or ground), for example, through separate lines connected to the first voltage, and each of the separate second group structures G2 connects separately from the other second group structures G2 to the second voltage source (i.e., a power voltage source or ground), for example, through separate lines connected to the second voltage. According to one embodiment, it is assumed that a left side of the first region R1 is referred to as a first side L1, and the other sides are clockwise referred to as a second side L2, a third side L3, and a fourth side L4, respectively. Ends in a lengthwise direction of the respective first group structures G1 may extend to the second side L2 and the fourth side L4. In addition, ends in a lengthwise direction of the respective second group structures G2 may also extend to the second side L2 and the fourth side L4.

As another embodiment, as shown in FIG. 1E, a plurality of first group structures G1 may be provided. A second group structure G2 may be disposed between the first group structures G1 and may surround the first group structures G1. As such, only one second group structure G2 may be provided. Both lengthwise ends of each respective first group structure G1 may be spaced apart from the second side L2 and the fourth side L4 of the first region R1 by the second group structure G2.

As set forth above, the terminals of the first connection pattern 164a, which are electrically connected to each other via the first wiring 160a and the first via contacts 158a, may constitute the first group structure G1. And the terminals of the second connection pattern 164b, which are electrically connected to each other via the second wiring 160b and the second via contacts 158b, may constitute the second group structure G2. Thus, the first and second electrodes 152a and 152b of the second capacitor 156 may be more efficiently applied with a predetermined voltage. As a result, electrical characteristics of the semiconductor package 10 may be improved. Furthermore, stable electric pathways can be established by virtue of the plurality of the first and second via contacts. For example, a single voltage can be applied to a group of connection terminals in a single continuous region (e.g., the region covered by a unit structure) to supply voltage to those terminals.

Figure 2A:
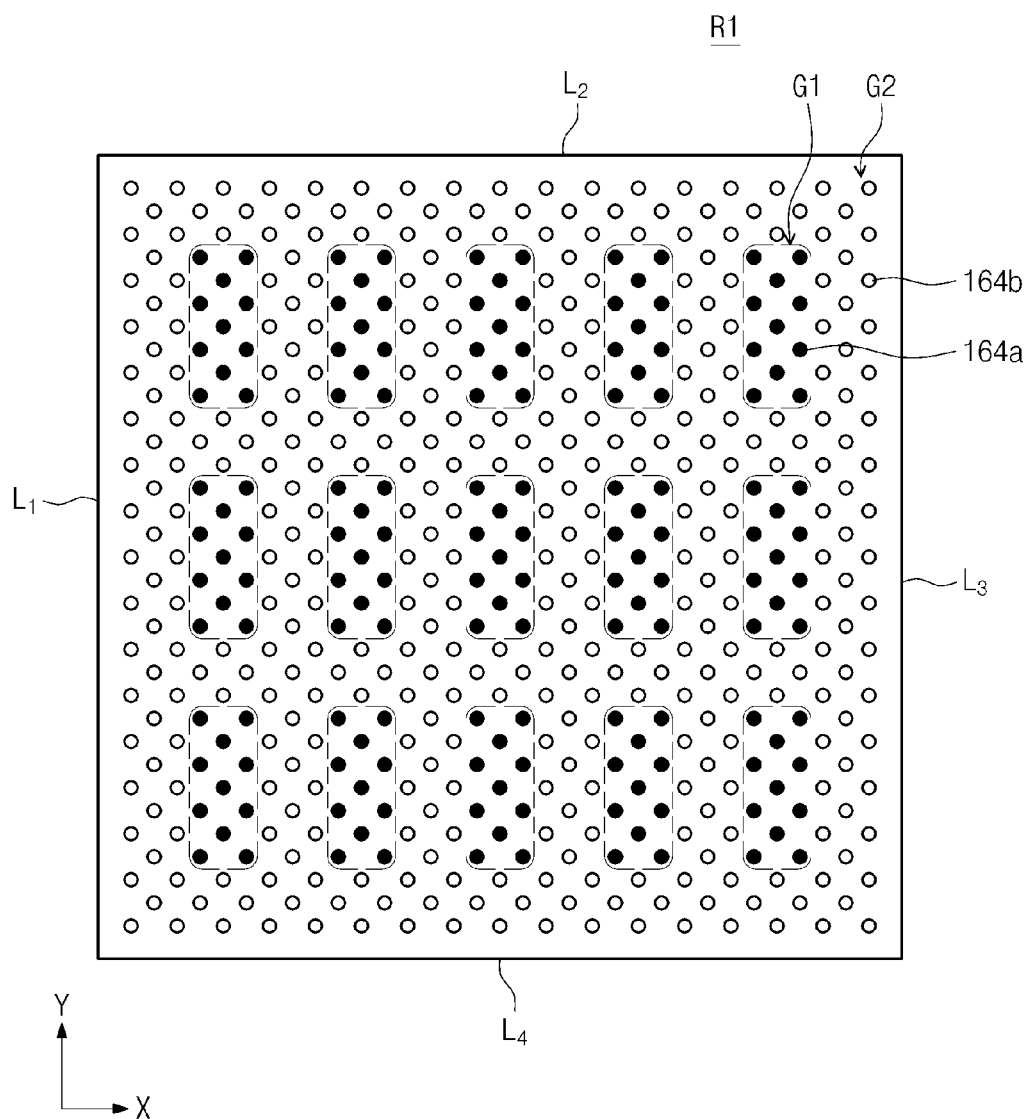
FIGS. 2A and 2B are top plan views illustrating an arrangement structure of first and second connection patterns of a semiconductor package according to one exemplary embodiment.
Figure 2B:
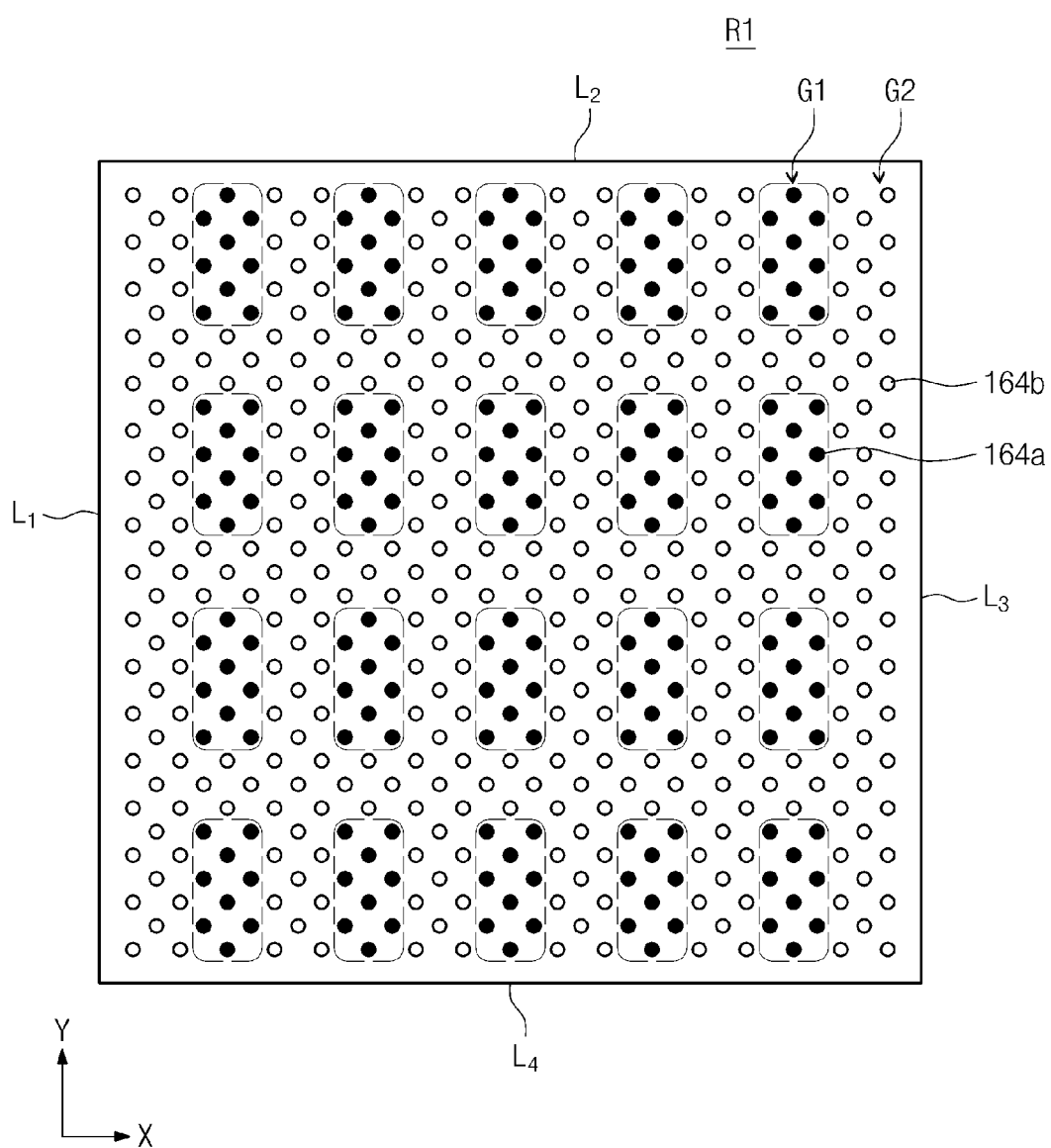

FIGS. 2A and 2B are top plan views illustrating an arrangement structure of first and second connection patterns of a semiconductor package according to one exemplary embodiment.

In this embodiment, except for an arrangement structure of first and second connection patterns 164a and 164b, first and second via contacts 158a and 158b, first and second wirings 160a and 160b, and the number of second capacitors 156, a package substrate 150, an intermediate substrate 102, and a semiconductor chip 104 may be substantially identical to the package substrate 150, the intermediate substrate 102, and the semiconductor chip 104 described in the above embodiment with reference to FIGS. 1A and 1B and will not be described in further detail. The arrangement shown in FIG. 2A may include, for example, a greater number of capacitors (e.g., a greater number of first and second electrodes), and a greater number of separate wirings, than the arrangement shown in FIG. 1D, to provide different voltages or signals to the different group structures.

Referring to FIGS. 2A and 2B, when viewed in plane, a first group structure G1 may have a rectangular shape extending lengthwise in a Y-axis direction. A plurality of first group structures G1 may be provided. The plurality of first group structures G1 may be arranged in a matrix in X-axis and Y-axis directions. A second group structure G2 may be disposed between the first group structures G1. In one embodiment, only one second group structure G2 is provided.

As one embodiment, as shown in FIG. 2B, first group structures G1 disposed on the edge of a first region R1 may be in contact with a second side L2 and a fourth side L4, respectively and may be spaced apart from first and third sides L1 and L3 by a second group structure G2.

As another embodiment, as depicted in FIG. 2A, first group structures G1 disposed on the edge of a first region R1 may be spaced apart from first through fourth sides L1, L2, L3, and L4 by a second group structure G2, such that the second group structure G2 surrounds the first group structures G1.

Figure 3A:
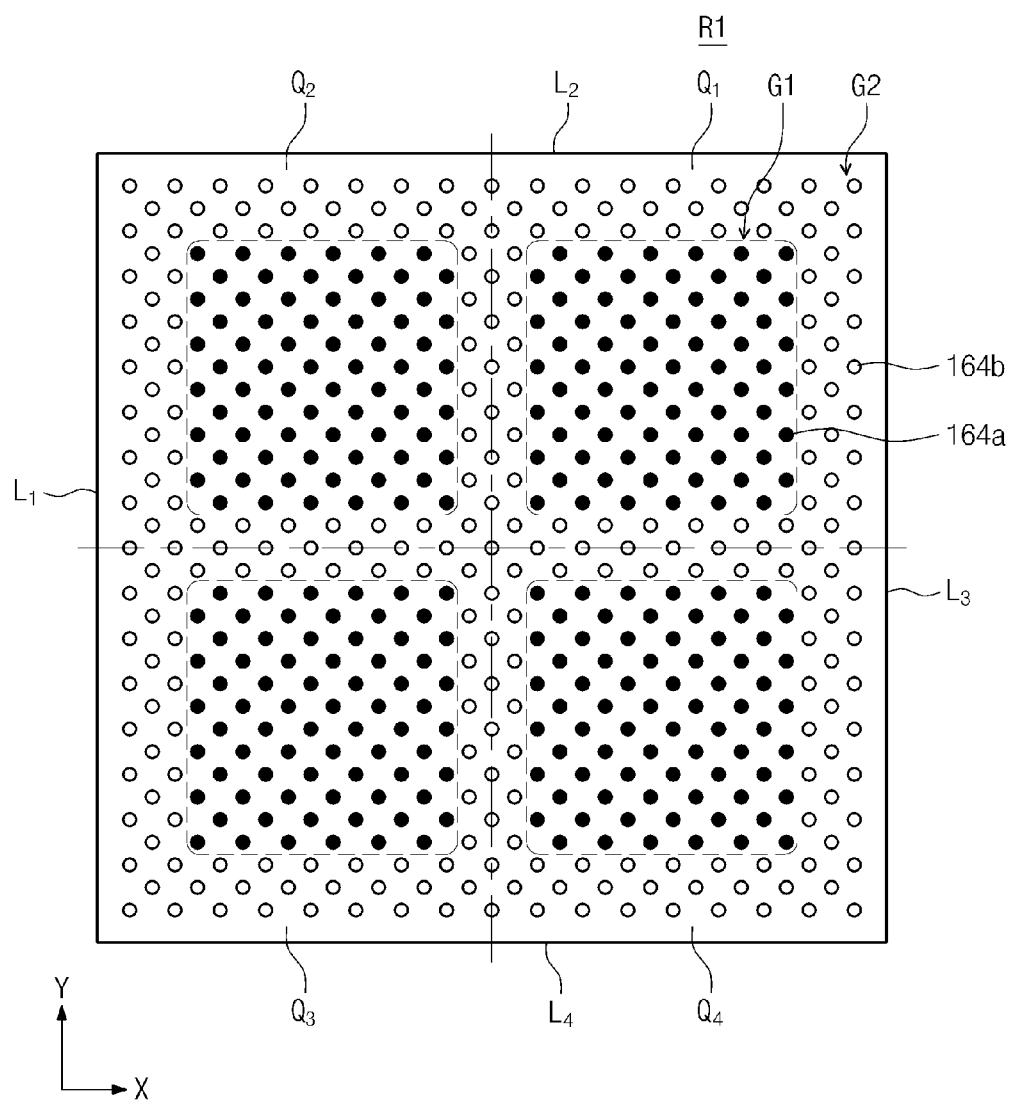
FIGS. 3A and 3B are top plan views illustrating an arrangement structure of first and second connection patterns of a semiconductor package according to another exemplary embodiment.
Figure 3B:
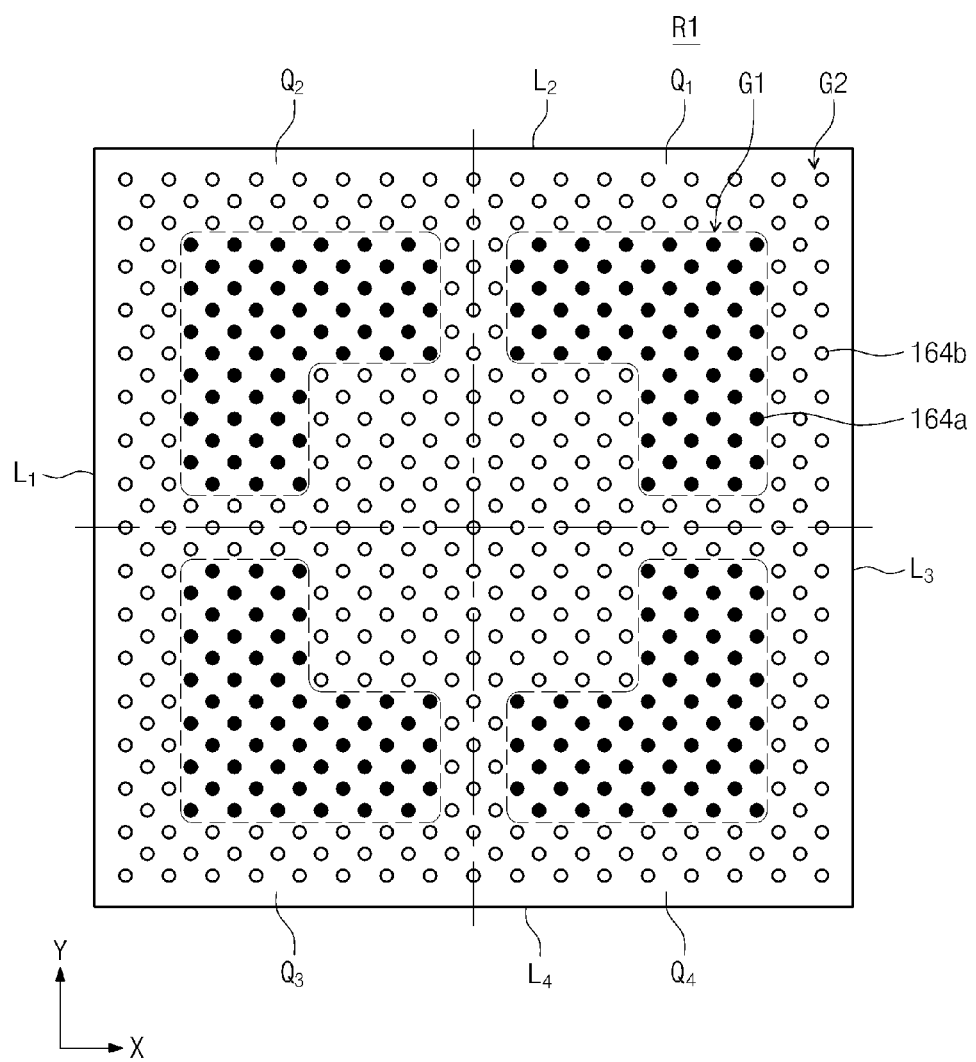

FIGS. 3A and 3B are top plan views illustrating an arrangement structure of first and second connection patterns of a semiconductor package according to another exemplary embodiment.

In this embodiment, except for an arrangement structure of first and second connection patterns 164a and 164b, first and second via contacts 158a and 158b, first and second wirings 160a and 160b, and the number of second capacitors 156, a package substrate 150, an intermediate substrate 102, and a semiconductor chip 104, may be substantially identical to the package substrate 150, the intermediate substrate 102, the semiconductor chip 104 described in above embodiment with reference to FIGS. 1A and 1B and will not be described in further detail. The arrangement shown in FIG. 3A may include, for example, a smaller number of capacitors (e.g., a smaller number of first and second electrodes), and a smaller number of separate wirings, than the arrangement shown in FIG. 1D, to provide different voltages or signals to the different group structures Referring to FIGS. 3A and 3B, a first group structure G1 may have a rectangular shape, or more particularly a square shape when viewed in plane. A plurality of first group structures G1 may be provided. More specifically, a first region R1 maybe divided into four sub-regions by virtual X-axis and Y-axis passing therethrough. Of the four sub-regions, a right upper region is referred to as a first quadrant Q1, and the other sub-regions are clockwise referred to as a second quadrant Q2, a third quadrant Q3, and a fourth quadrant Q4. Four first group structures G1 may be provided. The four first group structures G1 may be disposed in the first through fourth quadrants Q1, Q2, Q3, and Q4, respectively. A second group structure G2 may be disposed between the first group structures G1 to spatially separate the first group structures from each other, and may also surround the first group structures G1.

As one embodiment, as shown in FIG. 3A, first group structures G1 disposed on the edge of a first region R1 may be spaced apart from first through fourth sides L1, L2, L3, and L4 by a second group structure G2.

As another embodiment, as shown in FIG. 3B, first group structures G1 disposed in respective quadrants Q1, Q2, Q3, and Q4 may each have an L-shaped structure. More specifically, the first group structure G1 may be a structure in which a portion of a corner disposed adjacent to the center of the first region R1 is part of the second group structure G2. The first group structure G1 disposed in the third quadrant Q3 may have a shape of right "L". The first group structure G1 disposed in the fourth quadrant Q4 may have a shape of "L" that is bilaterally symmetrical to the right "L", and the first group structure G1 disposed in the second quadrant Q2 may have a shape of "L" that is vertically symmetrical to the right "L". In addition, the first group structure G1 disposed in the first quadrant Q1 may have a shape of "L" that is bilaterally and vertically symmetrical to the right "L".

FIGS. 4A through 4D are top plan views illustrating an arrangement structure of first and second connection patterns of a semiconductor package according to another exemplary embodiment.

In this embodiment, except for an arrangement structure of first and second connection patterns 164a and 164b, first and second via contacts 158a and 158b, first and second wirings 160a and 160b, and the number of second capacitors 156, a package substrate 150, an intermediate substrate 102, and a semiconductor chip 104 may be substantially identical to the package substrate 150, the intermediate substrate 102, and the semiconductor chip 104 described in above embodiment with reference to FIGS. 1A and 1B and will not be described in further detail.

Figure 4A:
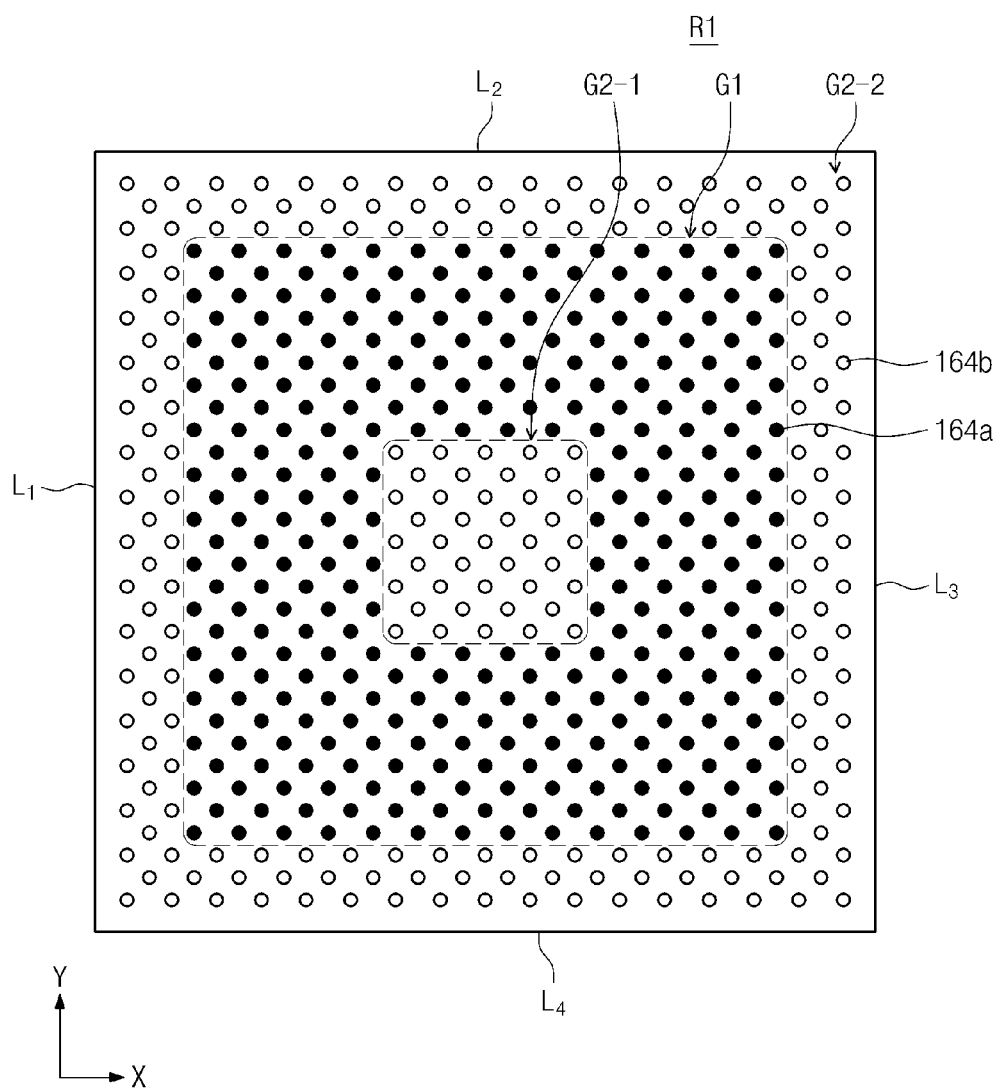
FIGS. 4A through 4D are top plan views illustrating an arrangement structure of first and second connection patterns of a semiconductor package according to another exemplary embodiment.

As an embodiment, as shown in FIG. 4A, a first group structure G1 may have a rectangular ring shape, or more particularly a square ring shape. The center of the first group structure G1 of the square ring shape may match that of a first region R1. A plurality of second group structures G2 may be provided. For example, two second group structures G2 may be provided. More specifically, the second group structures G2 may include one second group structure G2-1 disposed inside the first group structure G1 of the square ring shape and another second group structure G2-2 disposed to surround the exterior of the first group structure G1.

Figure 4B:
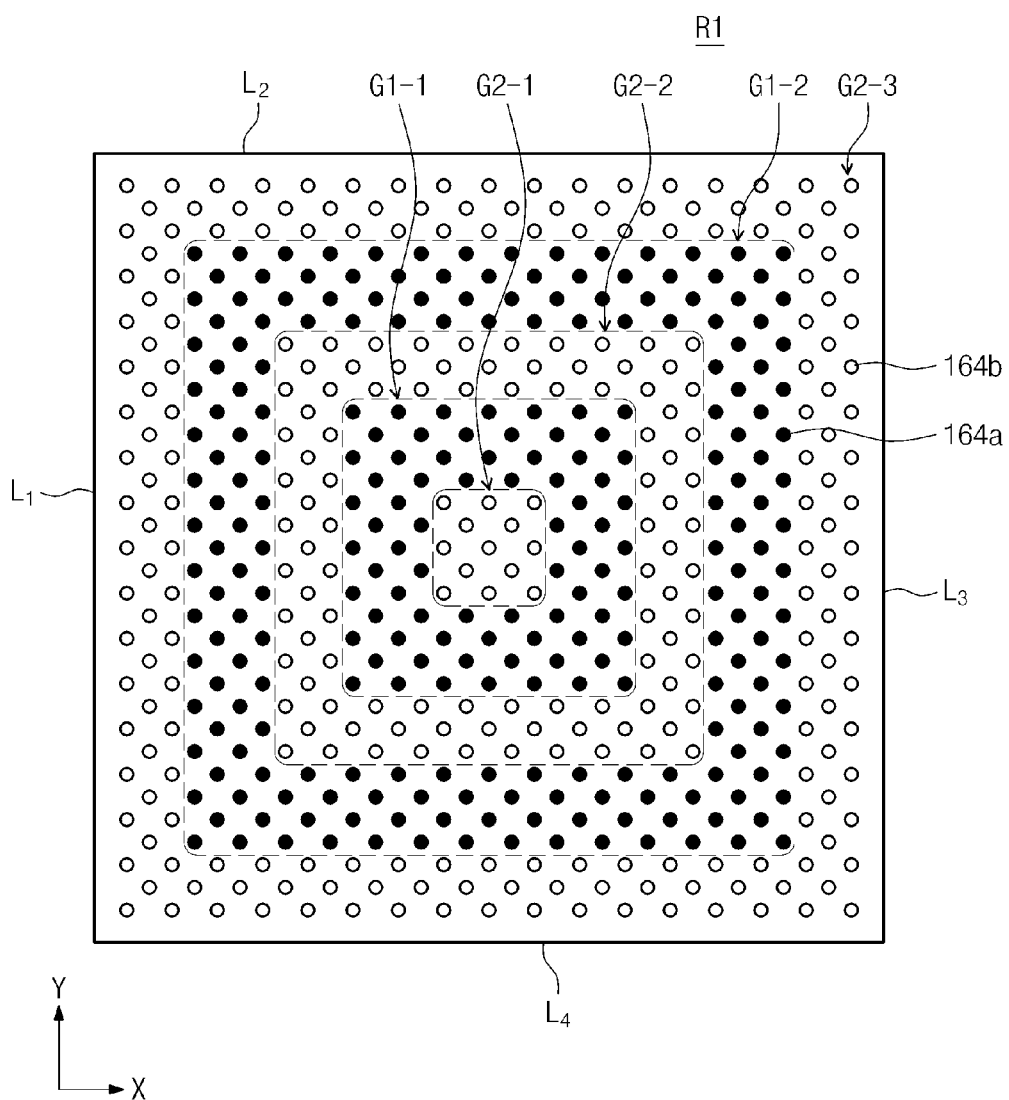

As another embodiment, as shown in FIG. 4B, the first group structure may have a square ring shape. First group structures G1 may have square ring shapes of different sizes. The centers of the first group structures G1 having square ring shapes may match the center of the first region R1. For example, the first group structures G1 may include two first group structures: one G1-1 is disposed adjacent to the center of the first region R1, and the other G1-2 is disposed adjacent to the edge of the first region R1. The two first group structures G1-1 and G1-2 may be spatially separated from each other. More specifically, the second group structures G2 may be disposed at the interior G2-1 and the exterior G2-2 of the first group structure G1, respectively and may be disposed at the exterior G2-3 of the first group structure G1 disposed at the edge of the first region R1.

Figure 4C:
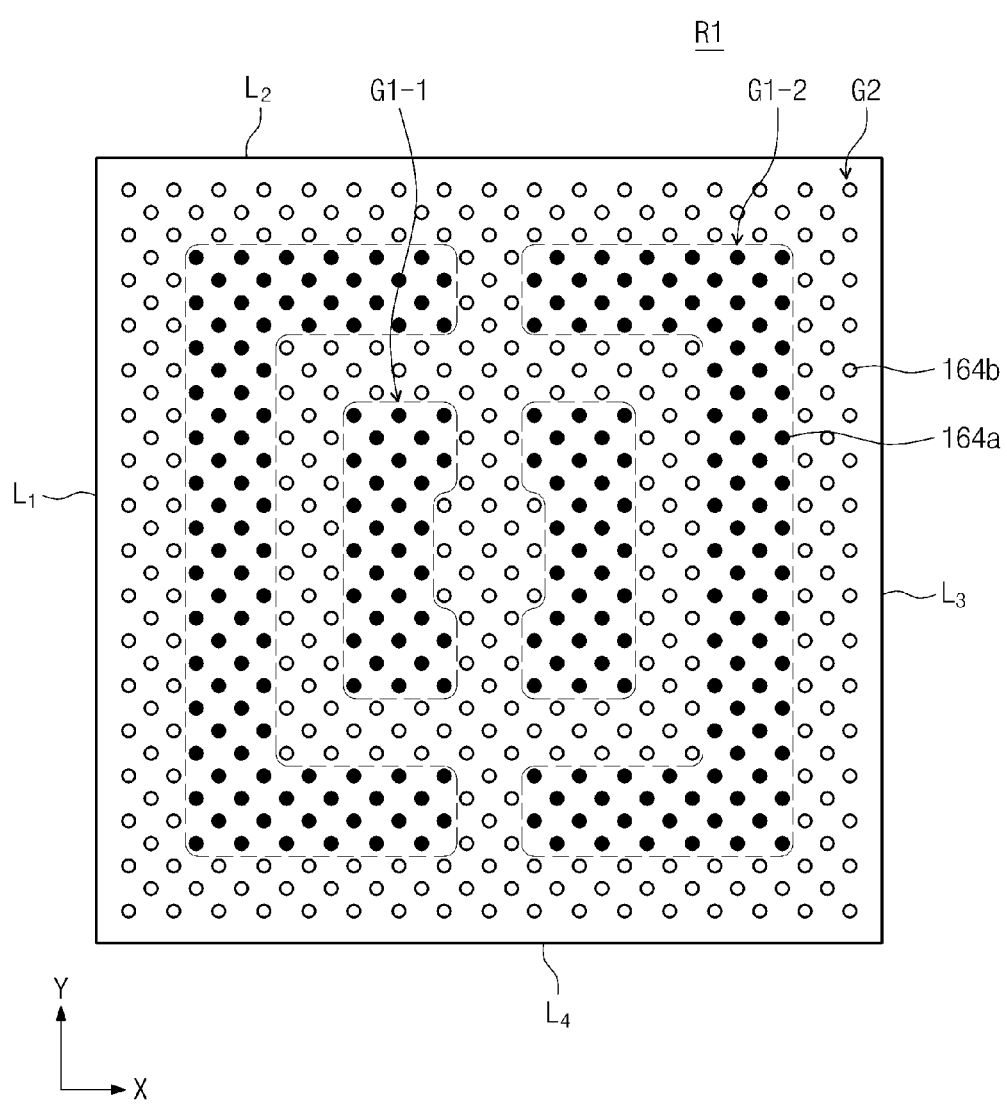

As another embodiment, as shown in FIG. 4C, in the first and second group structures G1 and G2 described in FIG. 4B, second group structures G2 may be merged into one structure by the second group structure G2 passing through the center of the first region R1 in a Y-axis direction. In this embodiment, the first group structures G1 may each have a square bracket shape.

Figure 4D:
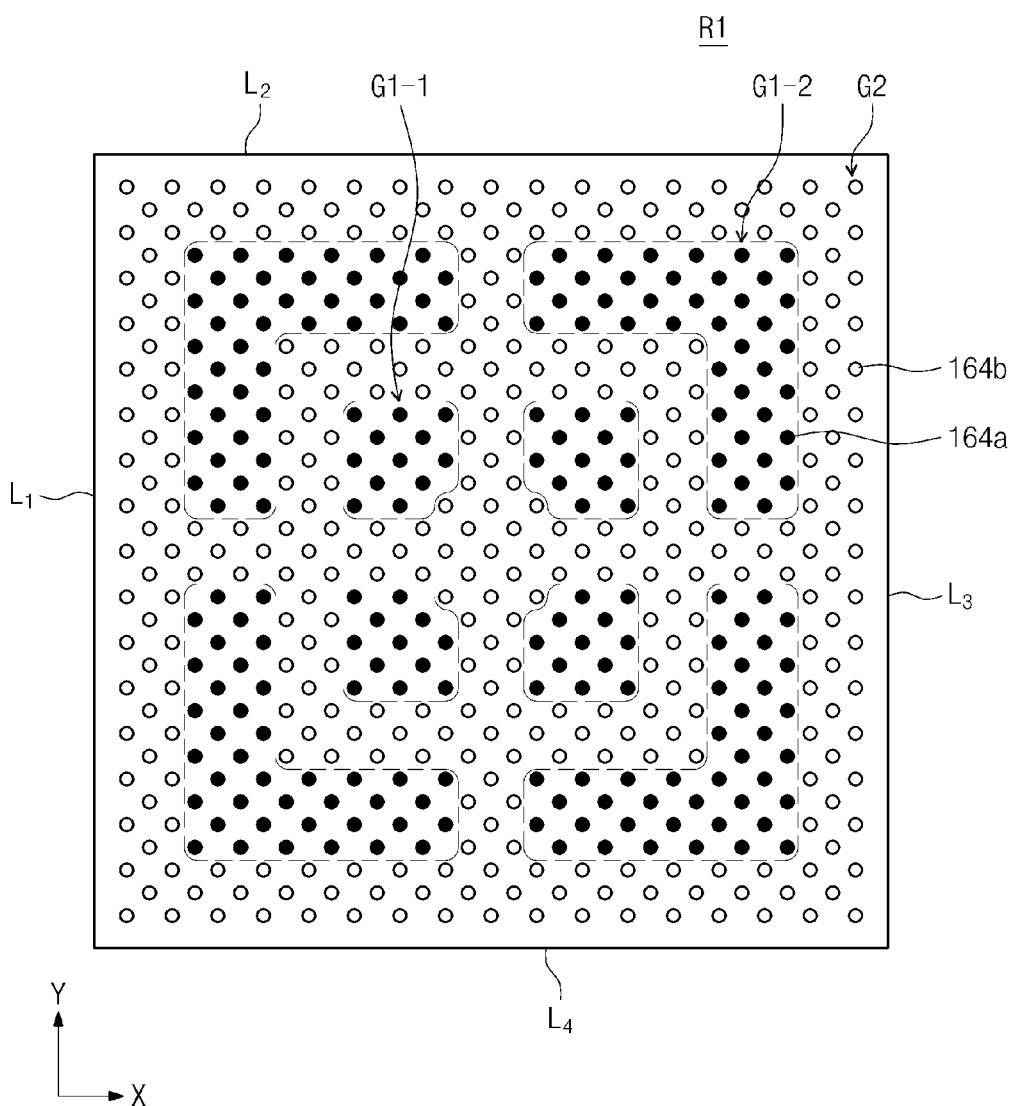

As another embodiment, as shown in FIG. 4D, in the first and second group structures G1 and G2 described in FIG. 4B, second group structures G2 may be merged into one structure by the second group structure G2 passing through the center of the first region R1 in X-axis and Y-axis directions. In this embodiment, the first group structures G1 may each have an L shape.

Figure 5A:
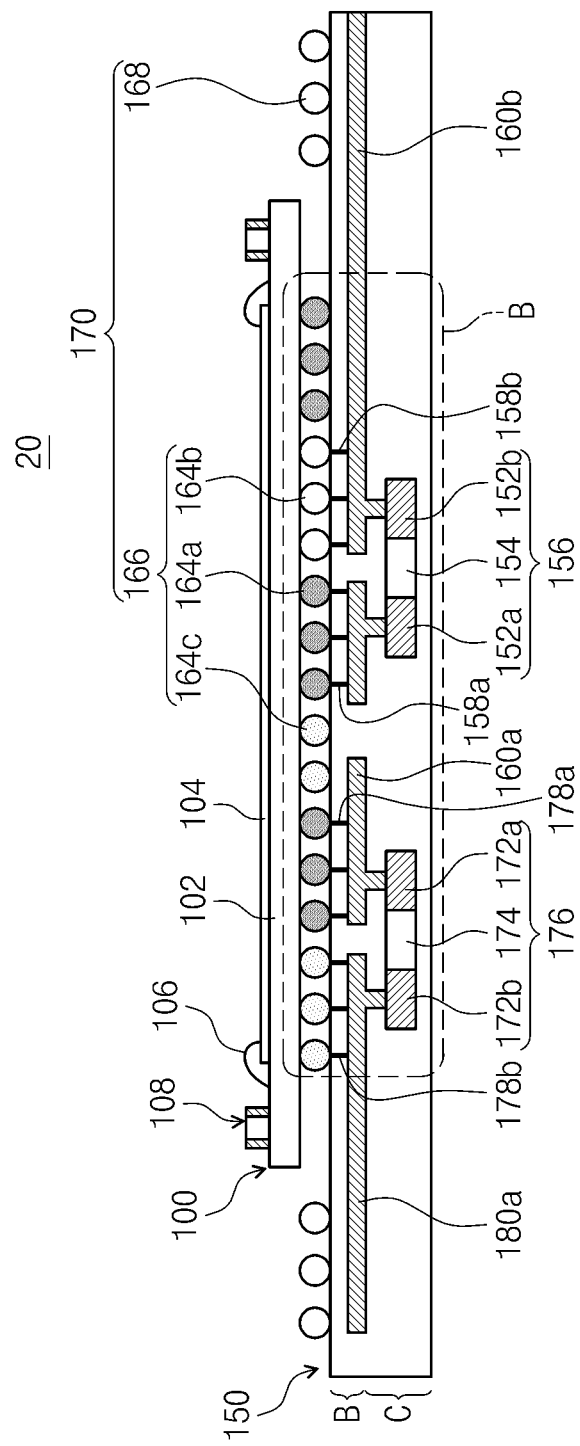
FIG. 5A is a cross-sectional view of a semiconductor package according to certain exemplary embodiments
Figure 5B:
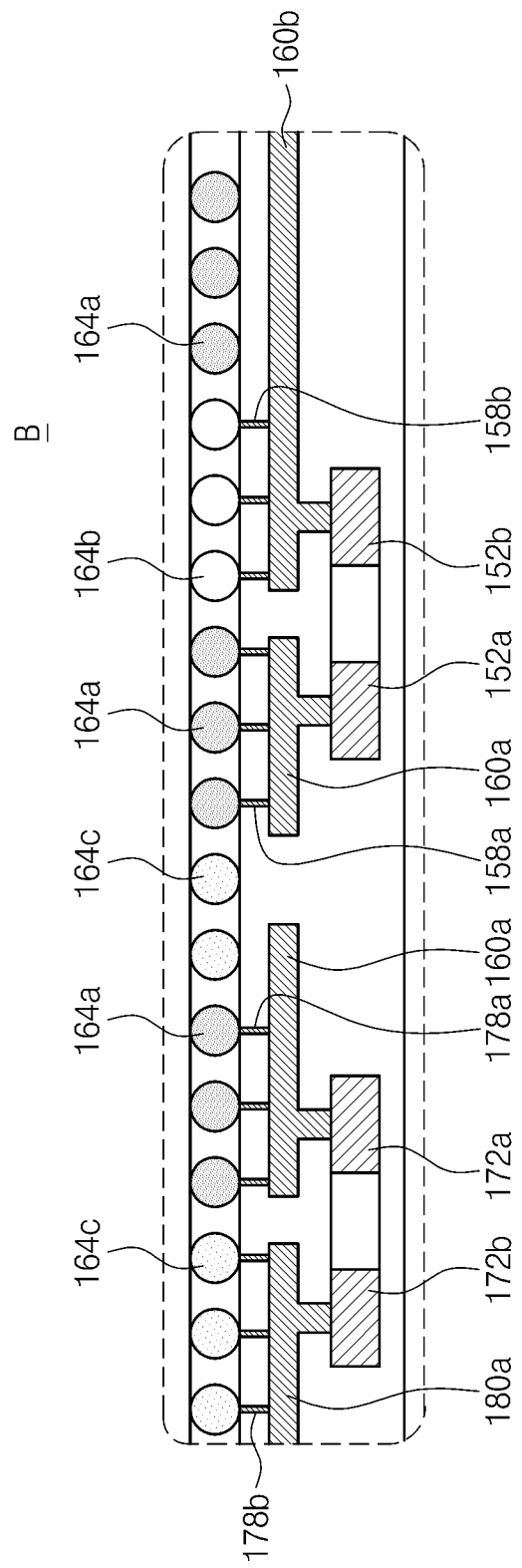
FIG. 5B is a partial enlarged view of the semiconductor package shown in FIG. 5A, according to certain exemplary embodiments.

FIG. 5A is a cross-sectional view of a semiconductor package according to certain other embodiments, and FIG. 5B is a partial enlarged view of the semiconductor package shown in FIG. 5A. FIG. 5B is an enlarged cross-sectional view of a "B" portion of the semiconductor package in FIG. 5A. A top plan view of FIG. 5A is omitted because a general configuration in FIG. 5A may be similar to that in FIG. 1C except for a configuration of a connection structure of a first region portion in the configuration of FIG. 1C.

FIGS. 6A through 6G are top plan views illustrating an arrangement structure of first and second connection patterns of a semiconductor package according to another exemplary embodiment. FIGS. 7A through 7E are top plan views illustrating an arrangement structure of first and second connection patterns of a semiconductor package according to another exemplary embodiment. FIGS. 8A through 8E are top plan views illustrating an arrangement structure of first and second connection patterns of a semiconductor package according to additional exemplary embodiments.

Referring to FIGS. 5A and 5B, a semiconductor package 20 may include a package substrate 150, an intermediate substrate 102, a semiconductor chip 104, and a connection structure 170 electrically connecting the intermediate substrate 102 to the package substrate 150. The connection structure 170 may include internal connection patterns 166 and external connection patterns 168. The internal connection patterns 166 may include a first connection pattern 164a, second connection pattern 164b, and third connection pattern 164c. In this embodiment, except for an arrangement structure of the connection patterns, the capacitors and their electrodes, and the via contacts, the package substrate 150, the intermediate substrate 102, and the semiconductor chip 104 may be substantially identical to the package substrate 150, the intermediate substrate 102, and the semiconductor chip 104 described in above embodiment with reference to FIGS. 1A and 1B and will not be described in further detail.

A second capacitor 156 may include a first electrode 152a, a second electrode 152b, and a first dielectric layer 154 disposed between the first and second electrodes 152a and 152b. The first electrode 152a and the second electrode 152b of the second capacitor 156 may be connected to circuit patterns 162 disposed in a buildup portion B, respectively. The circuit pattern 162 disposed in the buildup portion B may include a first wiring 160a and a second wiring 160b. For example, the first wiring 160a may be applied with a ground voltage, and the second wiring 160b may be applied with a power supply voltage.

Furthermore, at least one first via contact 158a and at least one second via contact 158b may be further disposed in the package substrate 150. The first via contact 158a may be electrically connected to the first wiring 160a and the second via contact 158b may be electrically connected to the second wiring 160b. The first via contact 158a may be electrically connected to a terminal of the first connection pattern 164a, and the second via contact 158b may be electrically connected to a terminal of the second connection pattern 164b. The first and second connection patterns 164a and 164b may be electrically connected to the second capacitors 156 via the first and second via contacts 158a and 158b.

The package substrate 150 may further include a third capacitor 176. The third capacitor 176 may be embedded in the package substrate 150. The third capacitor 176 may include a third electrode 172a, a fourth electrode 172b, and a dielectric layer 174 disposed between the third and fourth electrodes 172a and 172b. The third electrode 172a and the fourth electrode 172b of the third capacitor 176 may be electrically connected to the circuit patterns 162 disposed in the buildup portion B, respectively. The circuit pattern 162 disposed in the buildup portion B may further include a third wiring 180a. The third electrode 172a may be connected to the first wiring 160a, and the fourth electrode 172b may be connected to the third wiring 180a. For example, the first wiring 160a may be applied with a ground voltage, and the third wiring 180a may be applied with a second power supply voltage.

Furthermore, at least one third via contact 178a and at least one fourth via contact 178b may be further disposed in the package substrate 150. The third via contact 178a may be electrically connected to the first wiring 160a and the fourth via contact 178b may be electrically connected to the third wiring 180a. The third via contact 178a may be electrically connected to the corresponding one of the first connection patterns 164a, and the fourth via contact 178b may be electrically connected to the corresponding one of the third connection patterns 164c. The first and third connection patterns 164a and 164c may be electrically connected to the third capacitors 176 via the third and fourth via contacts 178a and 178b.

First through third connection patterns 164a, 164b, and 164c may electrically connect the intermediate substrate 102 to the package substrate 150. According to some embodiments, first connection patterns 164a may be electrically connected to first wirings 160a, second connection patterns 164b may be connected to a second wiring 160b, and third connection patterns 164c may be connected to the third wiring 180a.

Figure 6A:
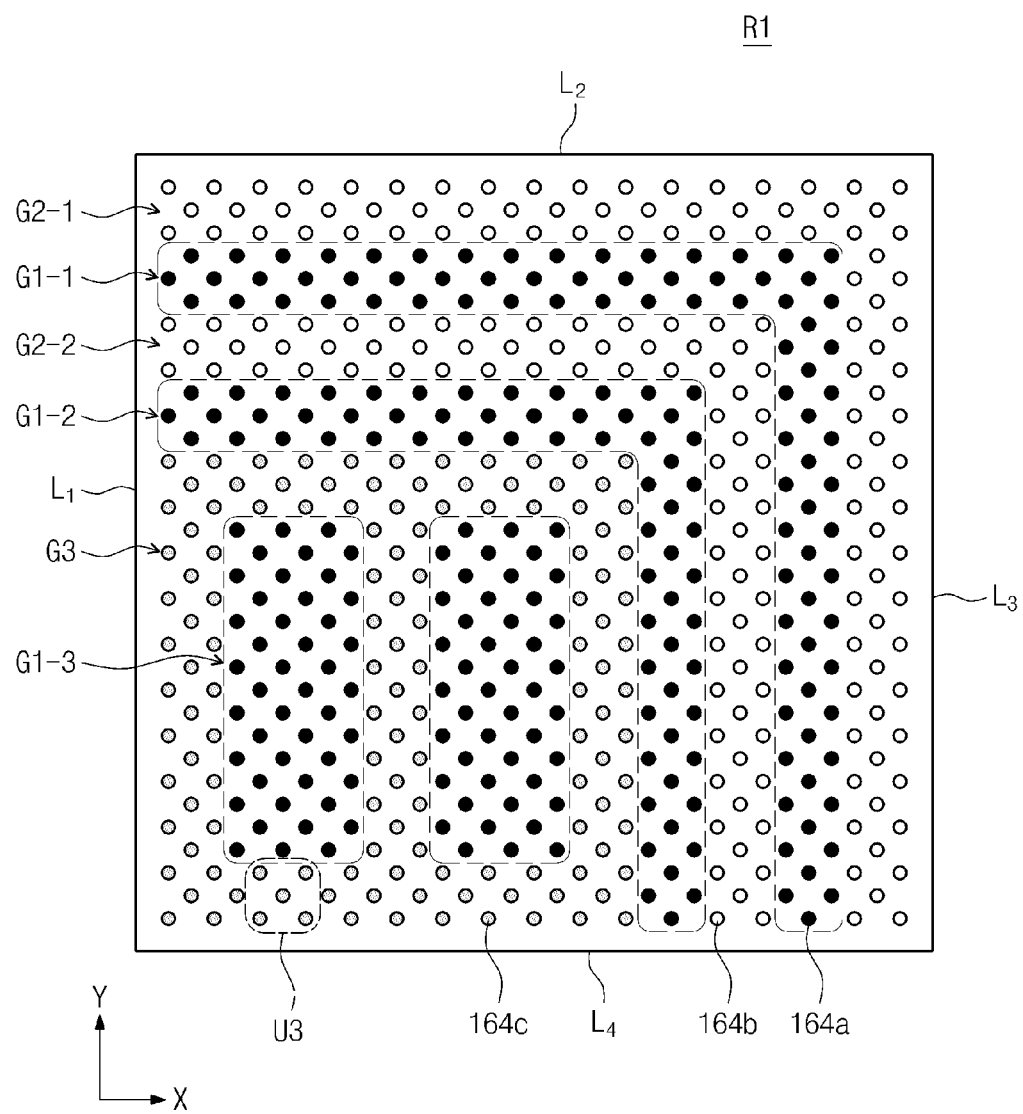
FIGS. 6A through 6G are top plan views illustrating an arrangement structure of first and second connection patterns of a semiconductor package according to another exemplary embodiment.

Referring to FIG. 6A, third connection patterns 164c may constitute a third group structure G3. The third group structure G3 may include a plurality of third unit structures U3.

Each of the third unit structures U3 may include one of the third connection patterns 164c and other four of the third connection patterns 164c disposed therearound. The four first connection patterns 164c may be arranged with the minimum distance from the first connection pattern 164a disposed in the central portion.

According to some embodiments of the inventive concept, the first group structure G1 and the third group structure G3 may be spatially separated by the second group structure G2. A plurality of first group structures G1, a plurality of second group structures G2, and a plurality of third group structures G3 may be provided. A space between the plurality of first group structures G1 may be spatially separated by the second group structure G2. In addition, a space between the plurality of third group structures G3 may be spatially separated by the second group structure G2. In one embodiment, each different type of group structure (e.g., G1, G2, and G3) may include a group of terminals commonly connected to a particular voltage (e.g., ground, first power supply voltage, second power supply voltage, or other voltage source).

Arrangement structures of the first through third connection patterns 164a, 164b, and 164c will now be exemplarily described below in detail.

As one embodiment, as shown in FIG. 6A, a second group structure G2 may be disposed adjacent to second and third sides L2 and L3. A plurality of second group structures G2 may be provided. Each of the second group structures G2 may have an L shape when viewed in plane. For example, in the case that two second group structures G2 are provided, one G2-1 may be disposed adjacent to the second and third sides L2 and L3, and the other G2-2 may be disposed within the second group structure G2-1 and have both ends disposed adjacent to first and fourth sides. In this case, a space between the two second group structures G2 may be separated by the first group structure G1.

The third group structure G3 may be disposed adjacent to first and fourth sides L1 and L4. One third group structure G3 may be provided to spatially separate a space between first group structures G1-3. The first group structure G1-3 surrounded by the third group structure G3 may have a square shape when viewed in plane. Particularly, in the case that two first group structures G1-3 are surrounded by the third group structure G3, they may be spaced in an X-axis direction. The first group structures G1-3 may be spaced apart from the first and fourth sides L1 and L4 by the third group structure G3.

Figure 6B:
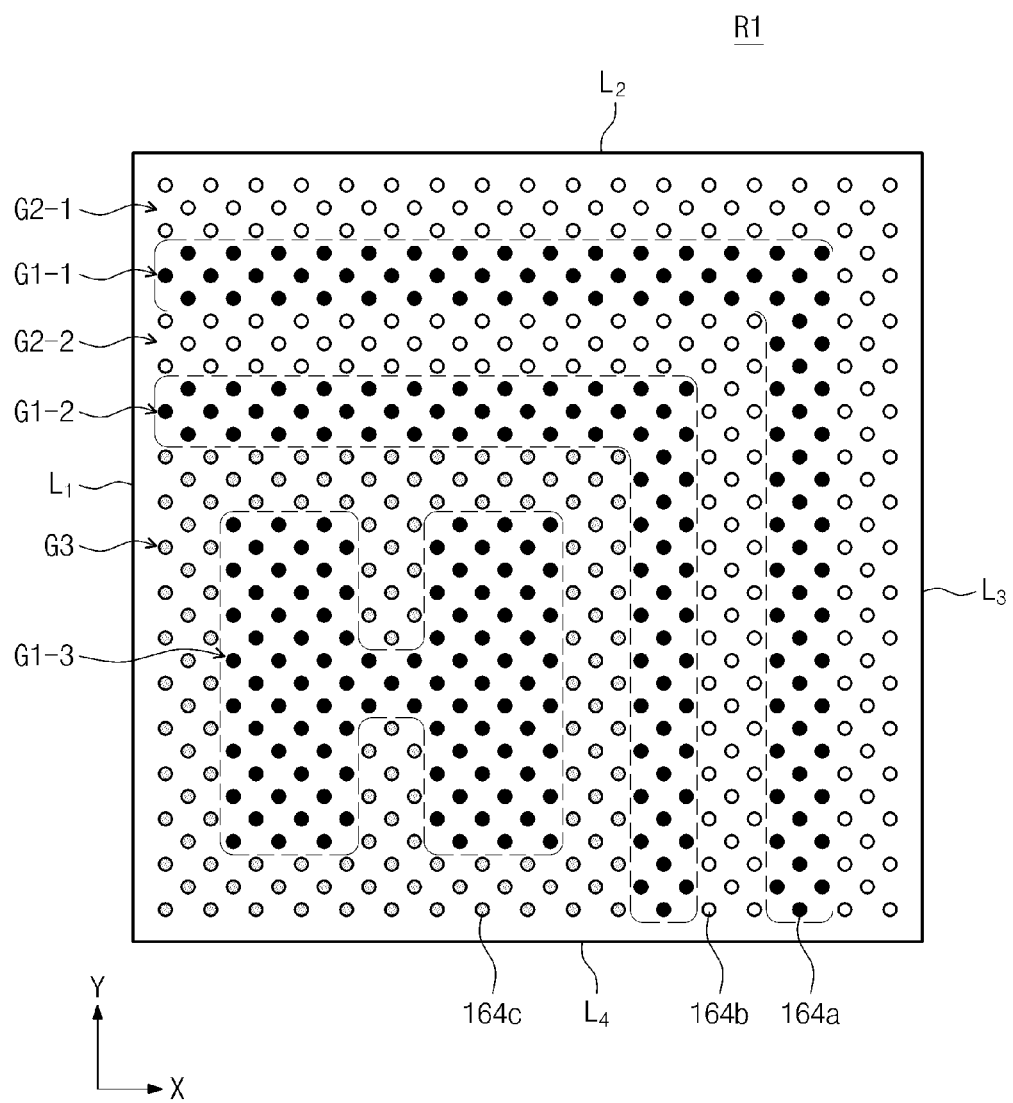

As another embodiment, as shown in FIG. 6B, the first group structures G1-3 surrounded by the third group structure G3 in FIG. 6A may be connected to each other. Thus, the first group structure G1-3 surrounded by the third group structure G1-3 may have a single-body structure (e.g., in an H shape). Referring to FIG. 6B, two second group structures G2, three first group structures G1, and one third group structure G3 may be provided.

Figure 6C:
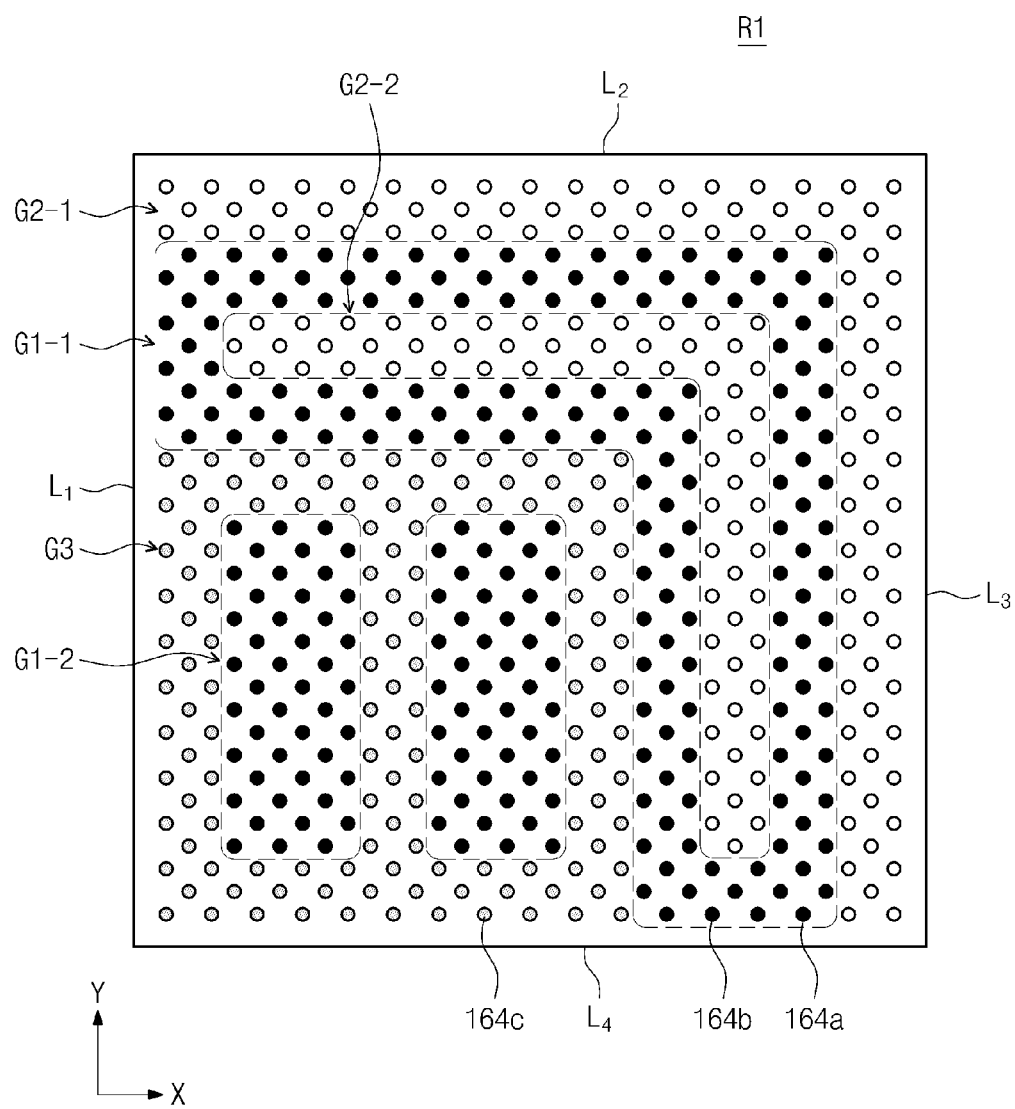

As another embodiment, as shown in FIG. 6C, a plurality of second group structures G2 may be provided. Each of the second group structures G2 may have an L shape when viewed in plane. For example, in the case that two second group structures G2 are provided, one G2-1 may be disposed adjacent to the second and third sides L2 and L3, and the other G2-2 may be disposed within the second group structure G2-1 and have both ends spaced apart from first and fourth sides L1 and L4 by the first group structure G1. The first group structure G1-1 disposed between the second group structures G2 and the first group structure G1-1 disposed to spatially separate a space between the second and third group structures G2 and G3 may be connected to each other to have a single-body structure. As illustrated, a single-body type first group structure G1-1 may be structured to surround a second group structure G2-2 therein.

Figure 6D:
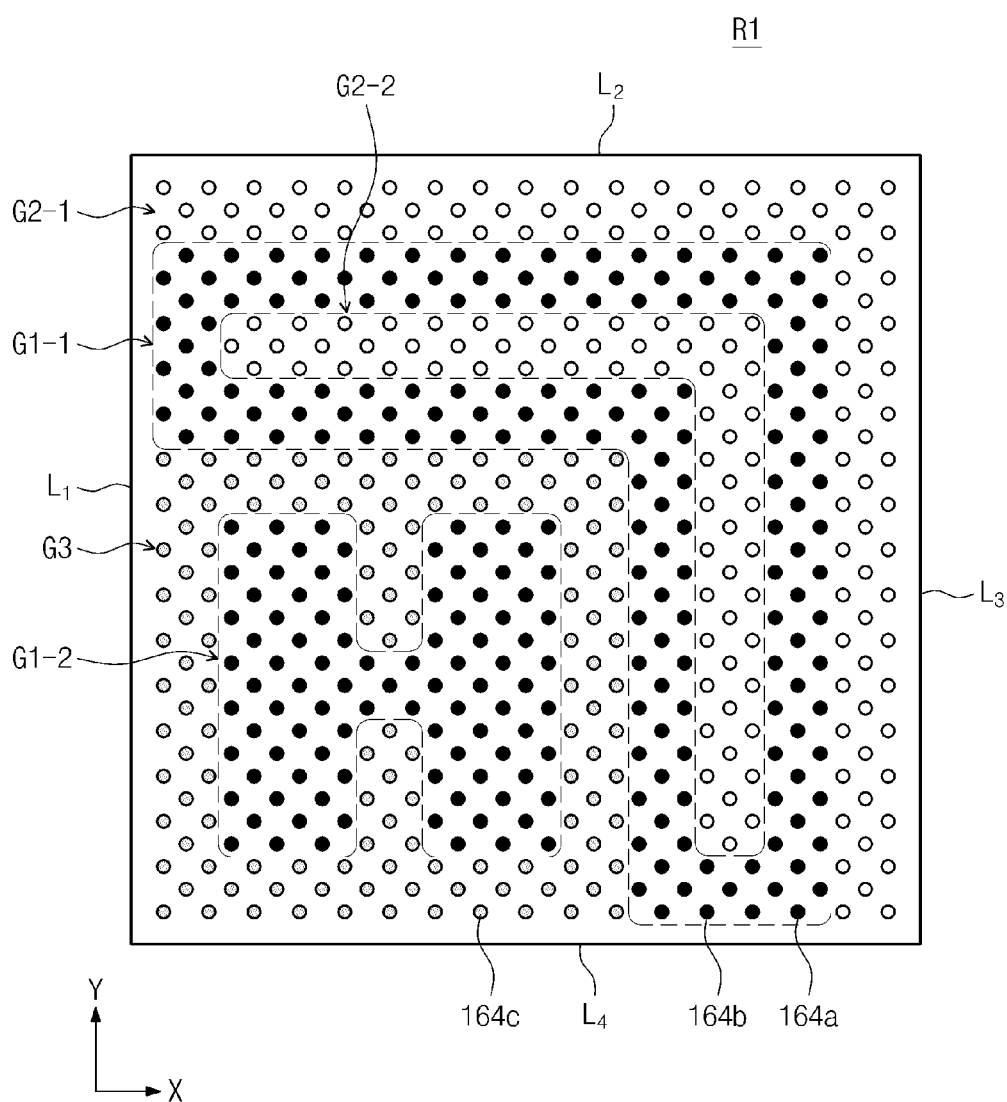

As another embodiment, as shown in FIG. 6D, the first group structures G1-2 surrounded by the third group structure G3 in FIG. 6C may be connected to each other (e.g., to form an H shape). Thus, the first group structure G1-2 surrounded by the third group structure G3 may have a single-body structure. Referring to FIG. 6D, two second group structures G2, two first group structures G1, and one third group structure G3 may be provided.

Figure 6E:
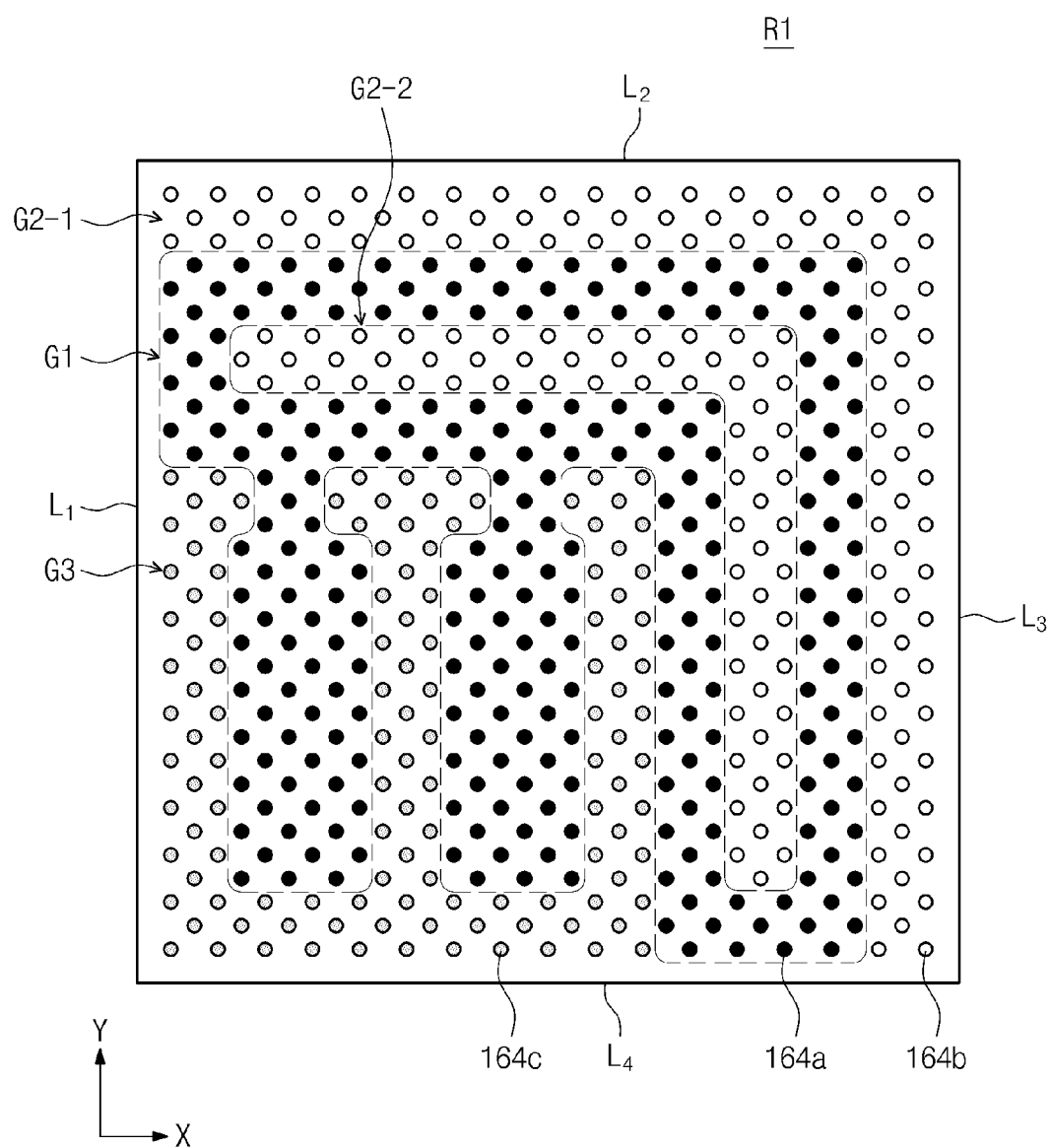

As another embodiment, as shown in FIG. 6E, the first group structures G1 surrounded by the third group structure G3 in FIG. 6C may be connected to the first group structure G1 disposed to spatially separate the second and third group structures G2 and G3. Thus, the first group structure G1 may be unified. Referring to FIG. 6D, two second group structures G2, one first group structure G1, and one third group structure G3 may be provided.

Figure 6F:
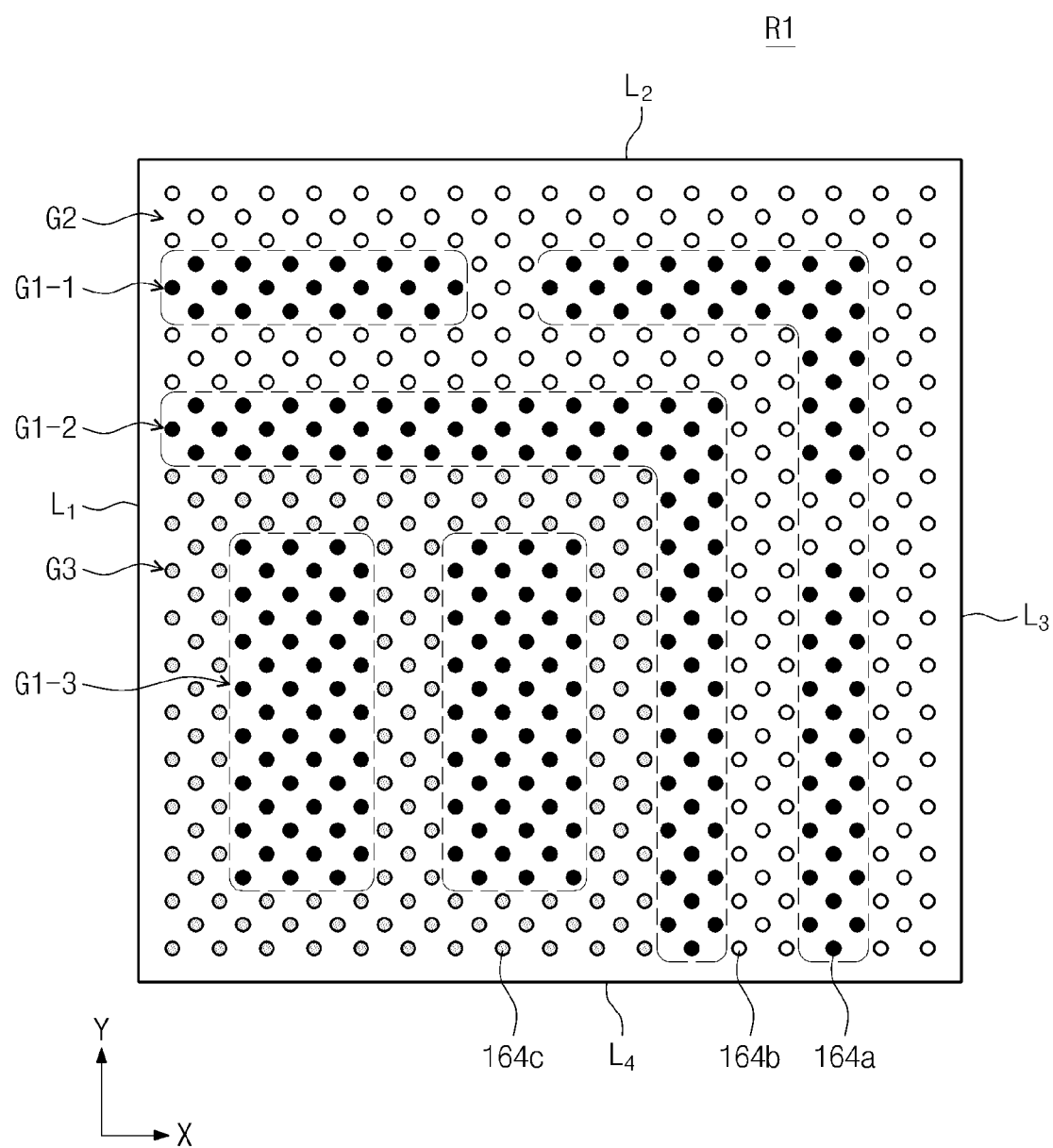

As another embodiment, as shown in FIG. 6F, the first group structure G1-1 disposed adjacent to the second group structure G2 in FIG. 6A may be divided into a plurality of first group structures. For example, although it is shown that three first group structures G1-1 are disposed adjacent to the second group structure G2, this embodiment of the inventive concept does not limit the number of first group structures disposed adjacent to the second group structure G2. Due to the division of the first group structures G1-1, second group structures G2 may be connected in a single body. Referring to FIG. 6F, one second group structure G2, six first group structures G1, and one third group structure G3 may be provided.

Figure 6G:
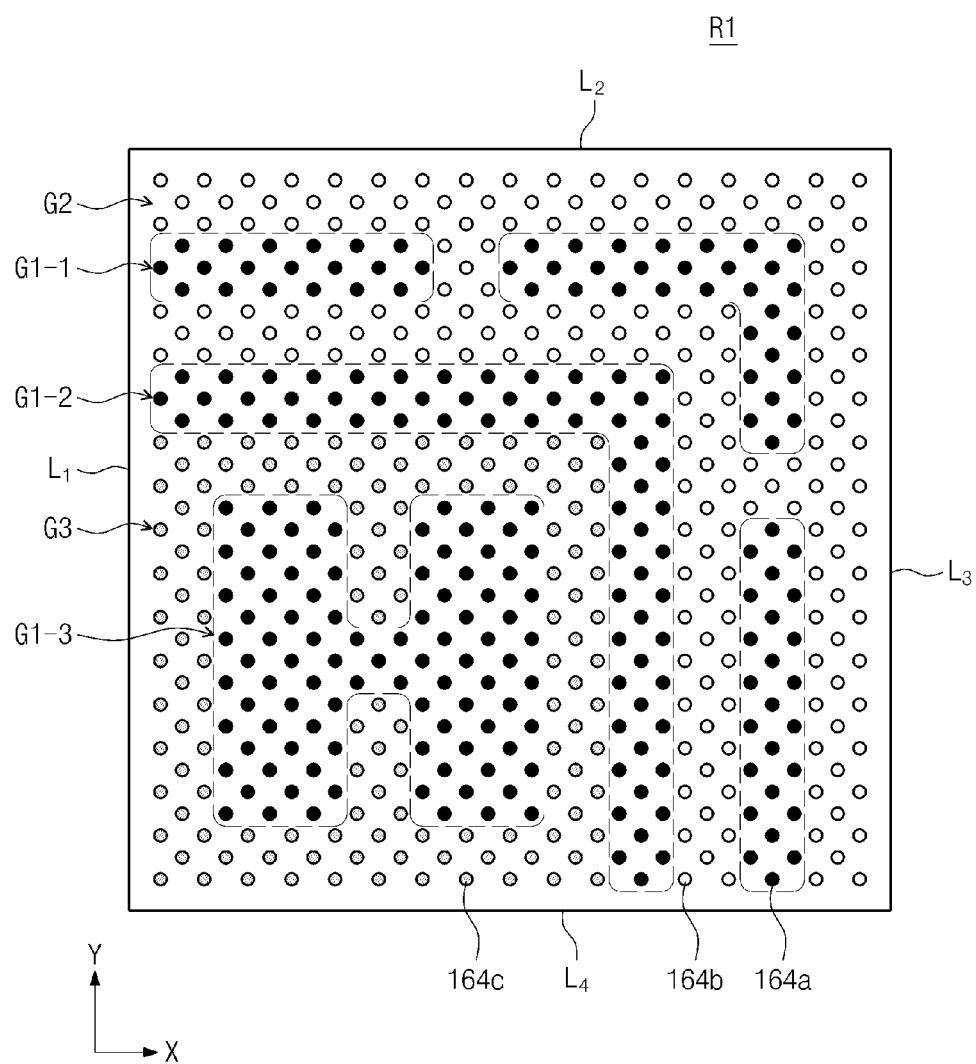

As another embodiment, as shown in FIG. 6G, the first group structures G1-3 surrounded by the third group structure G3 in FIG. 6F are connected to each other. Thus, the first group structure G1-3 surrounded by the third group structure G3 may have a single-body structure. Referring to FIG. 6G, one second group structure G2, six first group structures G1, and one third group structure G3 may be provided.

As discussed above in connection with FIGS. 1-6, different groups of terminals may be grouped together into different groups that are regionally separated from each other. That is, each group (i.e., each group structure) may comprise a plurality of terminals directly adjacent to each other in a particular continuous region (i.e., continuously adjacent to each other). In some embodiments, the continuous region has a simple shape, such as a rectangle, square, for example. Each different group of terminals may be connected to a single wiring (i.e., to a single continuous conductive line or plate) to which a particular voltage is applied, for example through a plurality of respective via contacts. Each individual wiring may be electrically connected to a capacitor electrode.

Figure 7A:
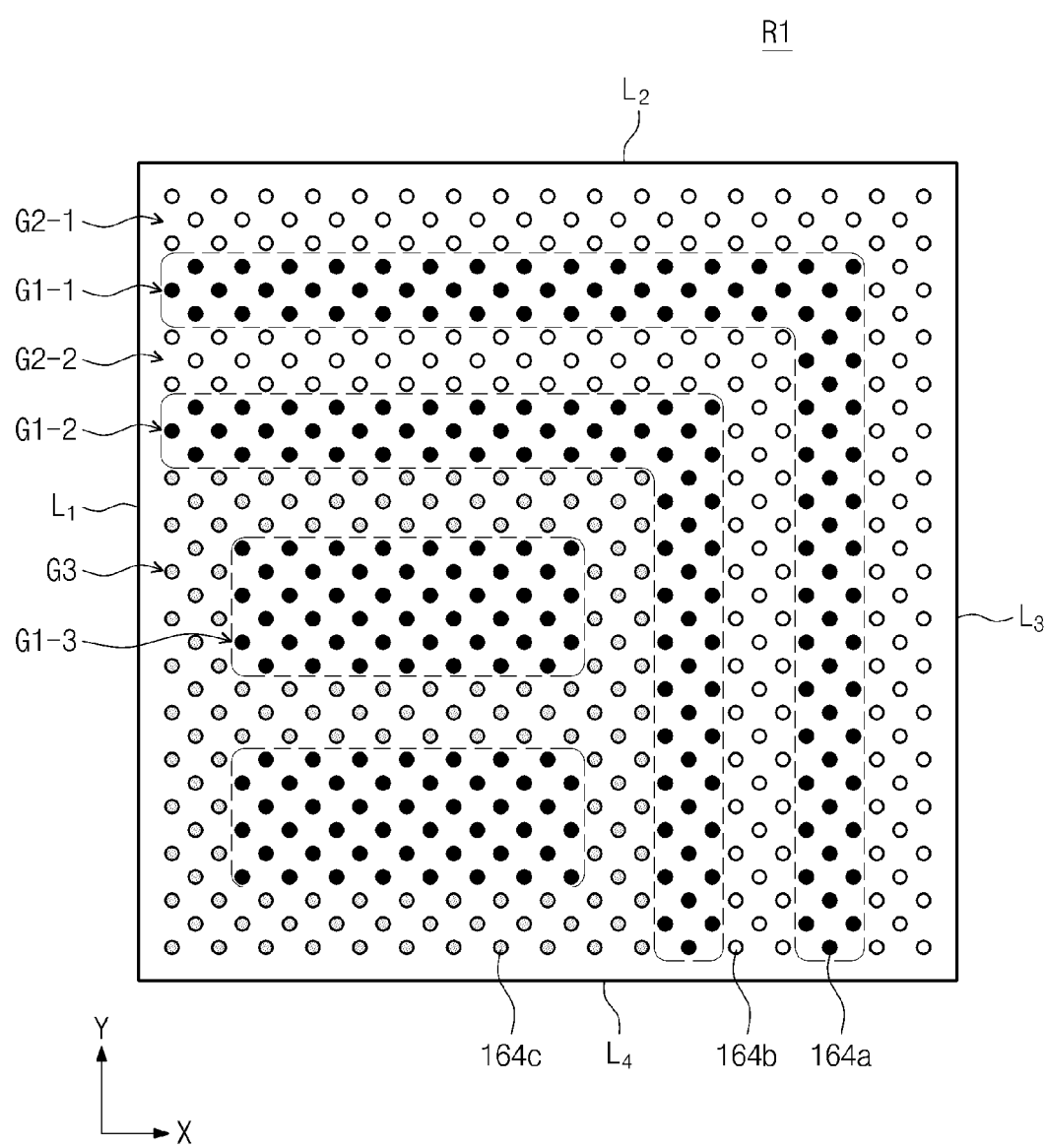
FIGS. 7A through 7E are top plan views illustrating an arrangement structure of first and second connection patterns of a semiconductor package according to another exemplary embodiment.

As another embodiment, as shown in FIG. 7A, except that the first group structure G1-3 surrounded by the third group structure G3 has a square shape taking an X-axis as the major axis, the arrangement of this embodiment may be identical to that of the first through third group structures G1, G2, and G3 described in FIG. 6A.

Figure 7B:
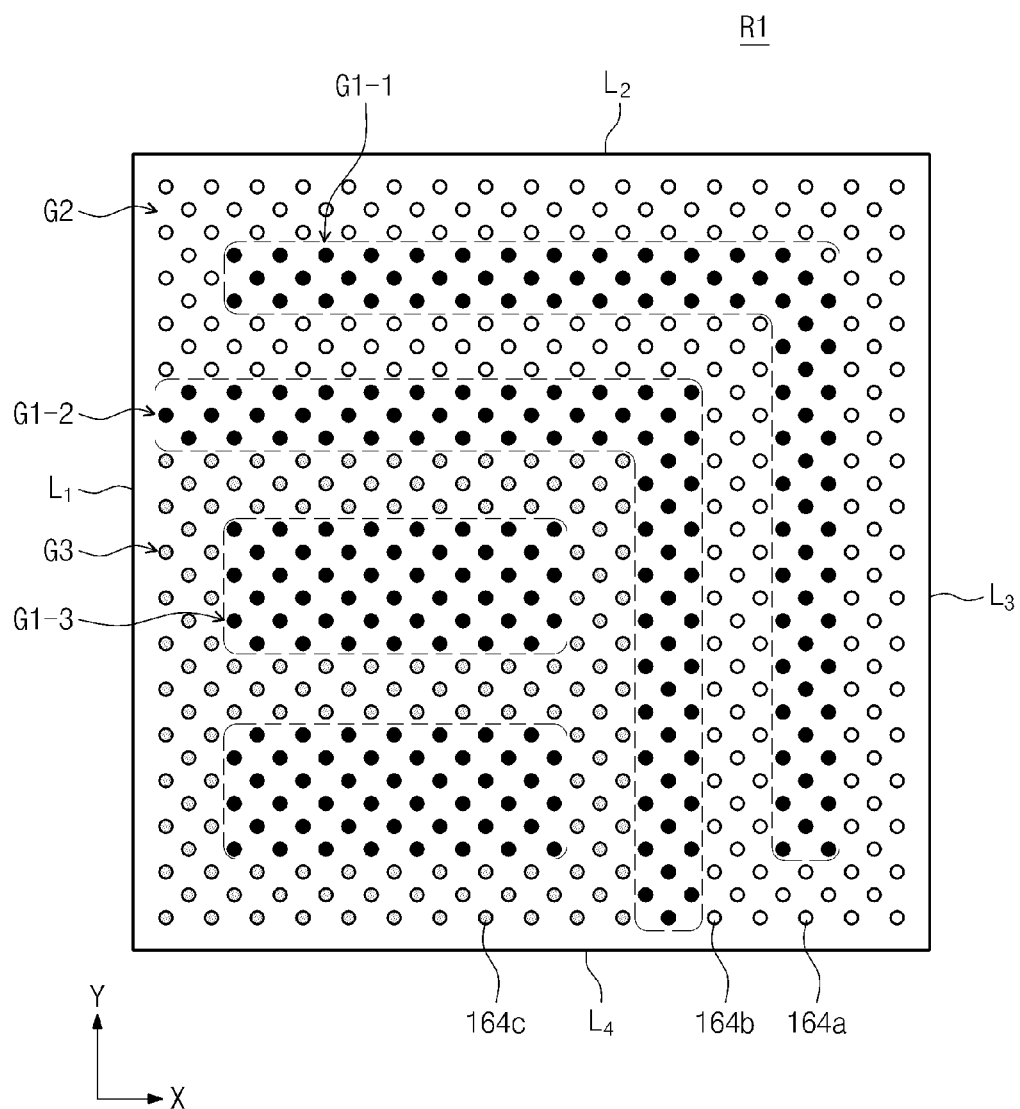

As another embodiment, as shown in FIG. 7B, first group structures G1 may include one first group structure G1-1 surrounded by second group structures G2, another first group structure G1-2 disposed to spatially separate second and third group structures G2 and G3, and other two first group structures G1-3 surrounded by a third group structure G3. The two first group structures G1-3 surrounded by the third group structure G3 may have a square shape taking an X-axis as the major axis. The configuration of the first through third group structures G1, G2, and G3 shown in FIG. 7B may be similar to that of the first through third group structures G1, G2, and G3 shown in FIG. 6A.

Figure 7C:
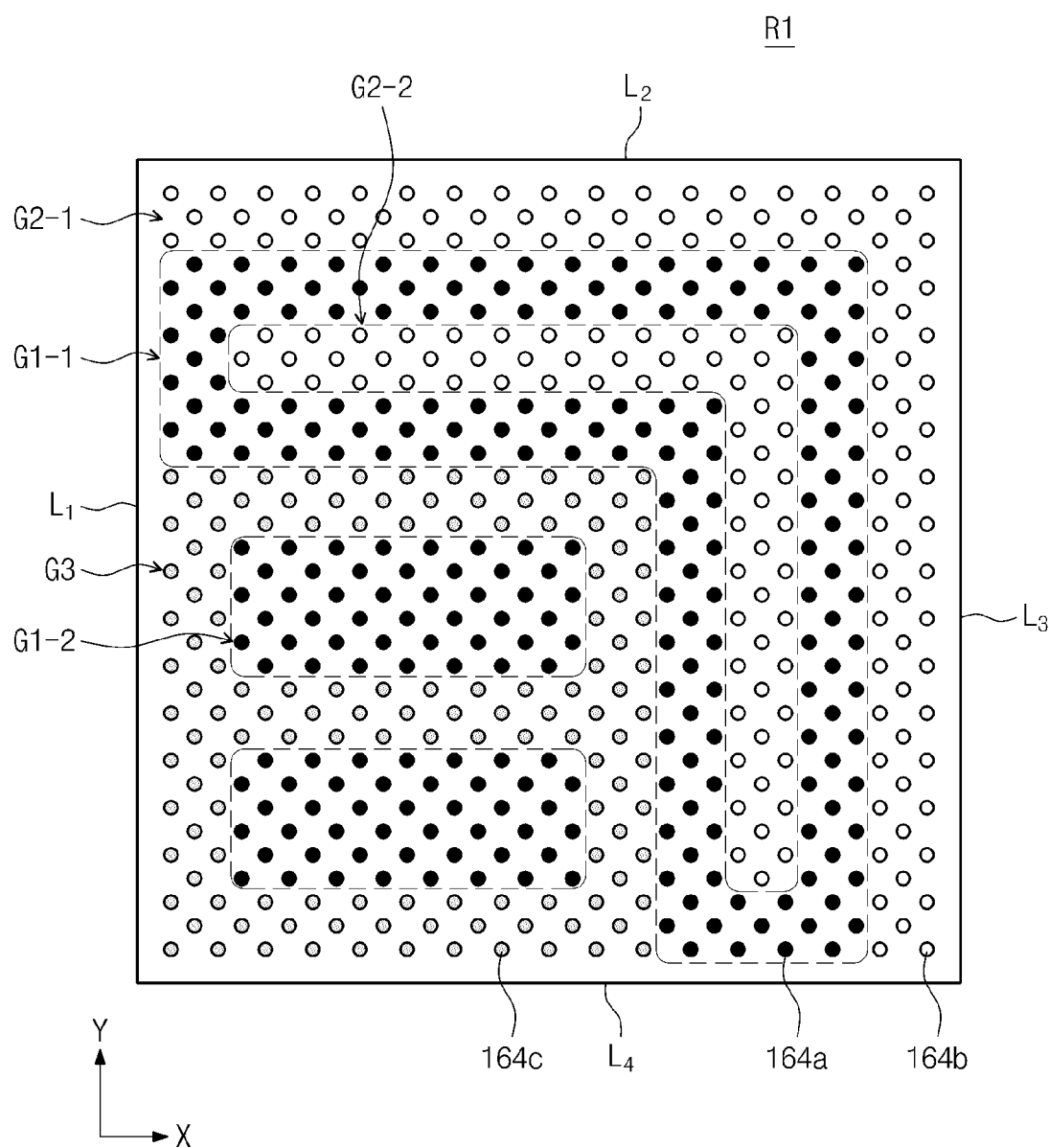

As another embodiment, as shown in FIG. 7C, except that a first group structure G1 surrounded by a third group structure G3 has a square shape taking an X-axis as the major axis, the arrangement of this embodiment may be identical to that of the first through third group structures G1, G2, and G3 described in FIG. 6C.

Figure 7D:
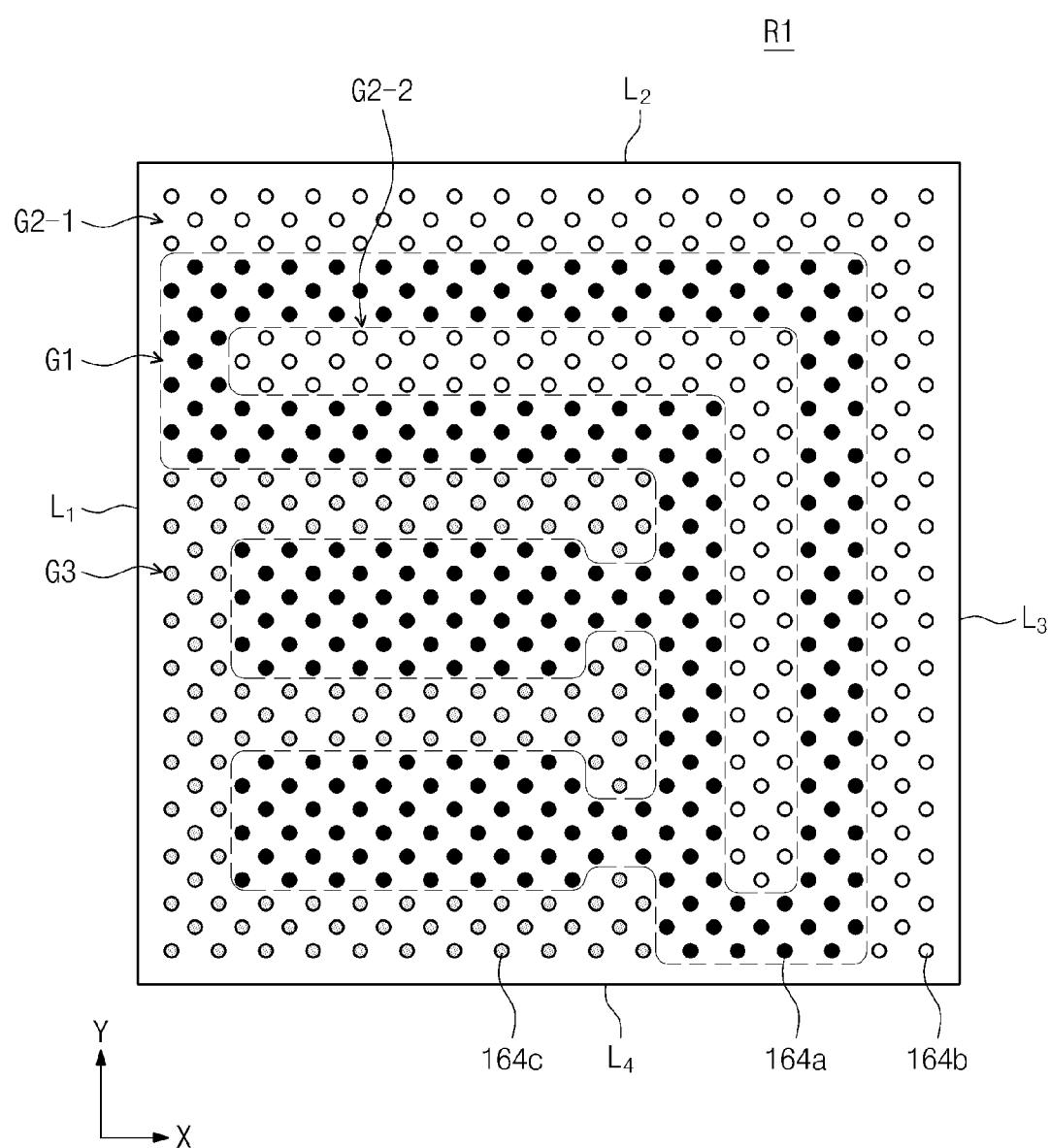

As another embodiment, as shown in FIG. 7D, a first group structure G1 surrounded by a third group structure G3 may have a square shape taking an X-axis as the major axis. In addition, a plurality of first group structures G1 may be connected to a first group structure G1 disposed to spatially separate second and third group structures G2 and G3 to unify the first group structure G1. In this case, a connection direction may be the X-axis direction.

Figure 7E:
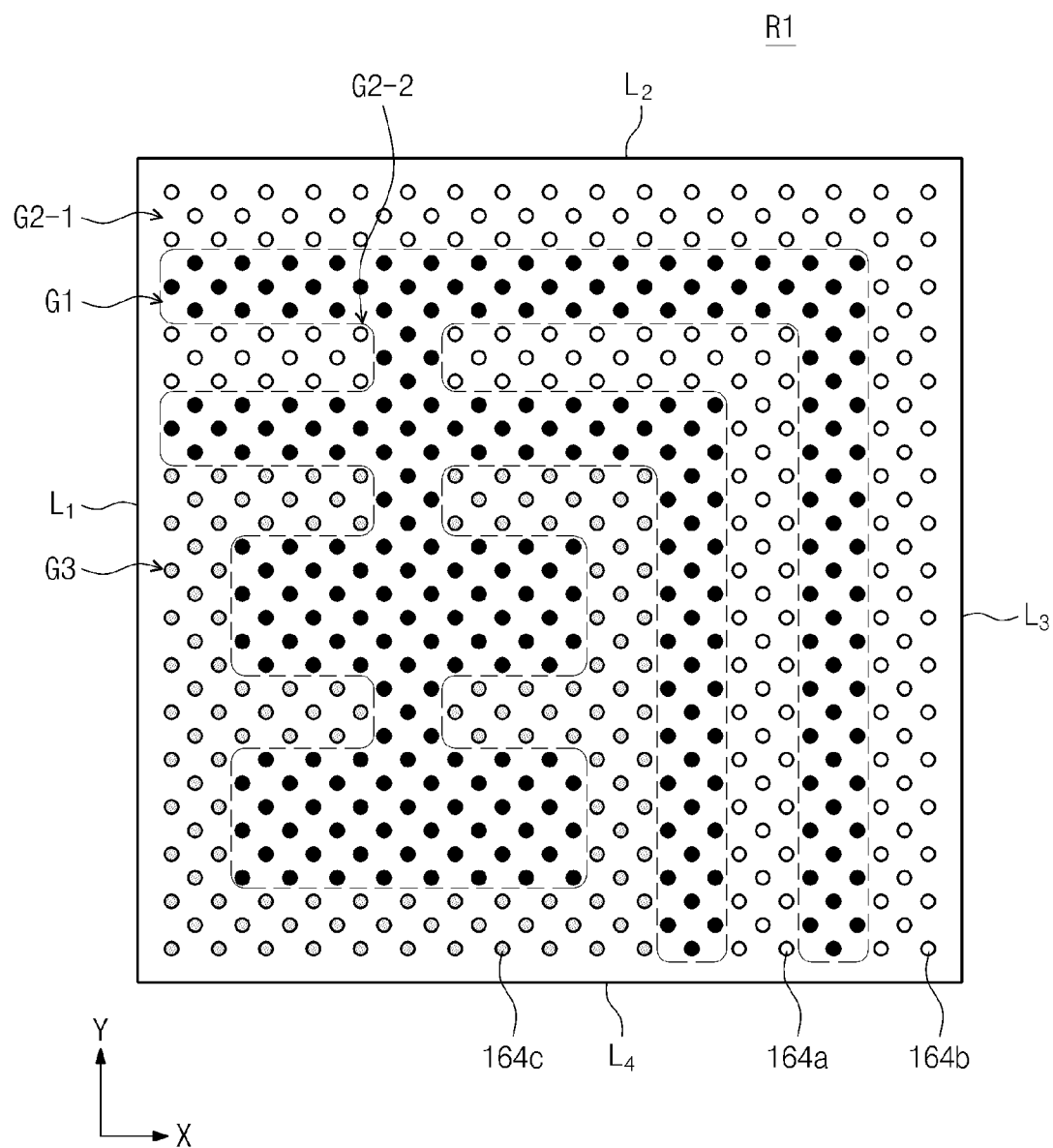

As another embodiment, as shown in FIG. 7E, the plurality of first group structures G1 surrounded by the third group structure G3 in FIG. 7A may be connected to each other in a Y-axis direction by a first group structure G1 disposed to spatially separate second and third group structures G2 and G3 and first group structures G1 to unify the first group structure G1.

Figure 8A:
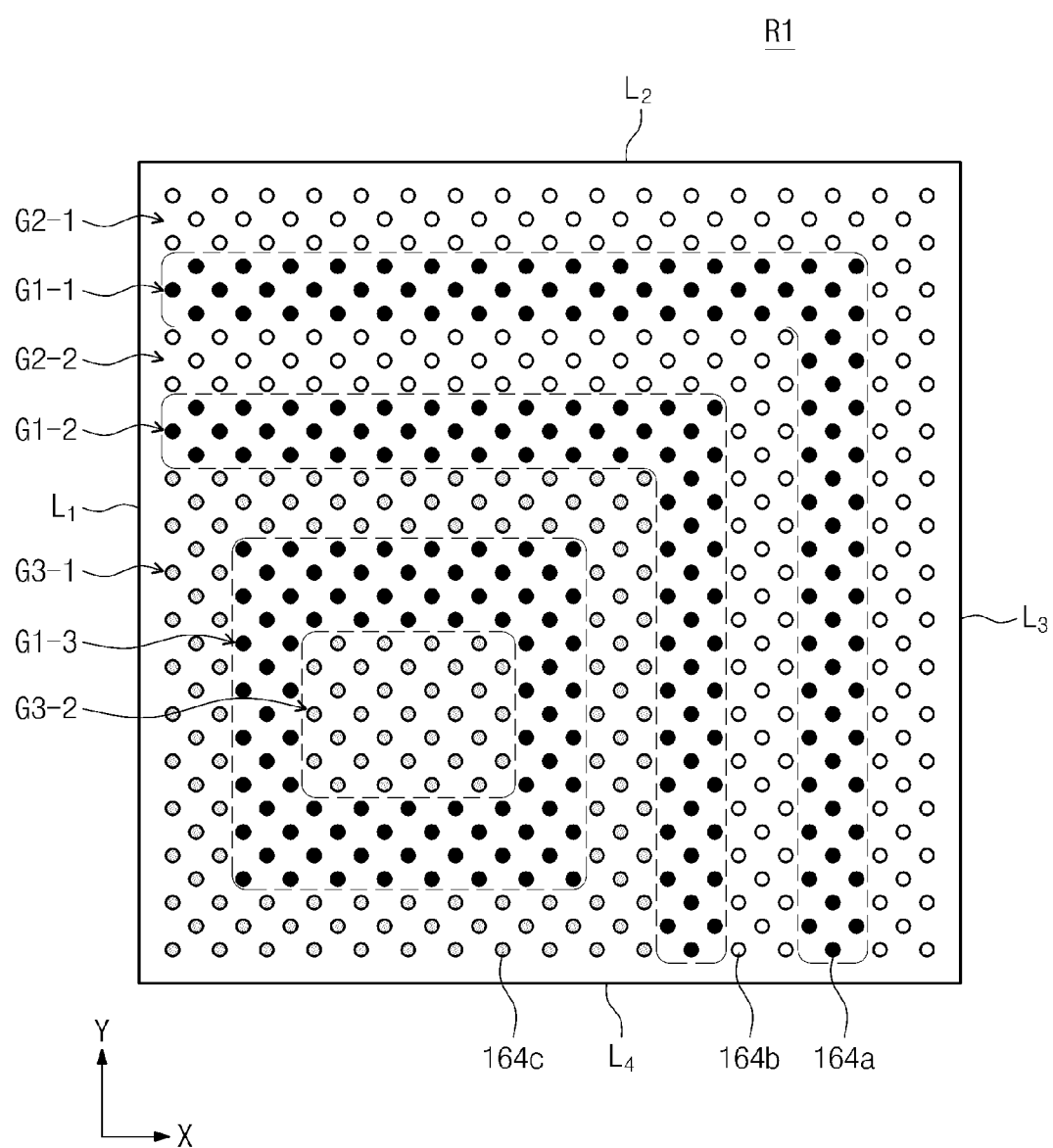
FIGS. 8A through 8E are top plan views illustrating an arrangement structure of first and second connection patterns of a semiconductor package according to another exemplary embodiment.

As another embodiment, as shown in FIG. 8A, except that third group structures G3-1 and G3-2 are divided into two structures by a first group structure G1-3 having a square ring shape, the arrangement of this embodiment may be identical to that of the first through third group structures G1, G2, and G3 described in FIGS. 6A and 7A.

Figure 8B:
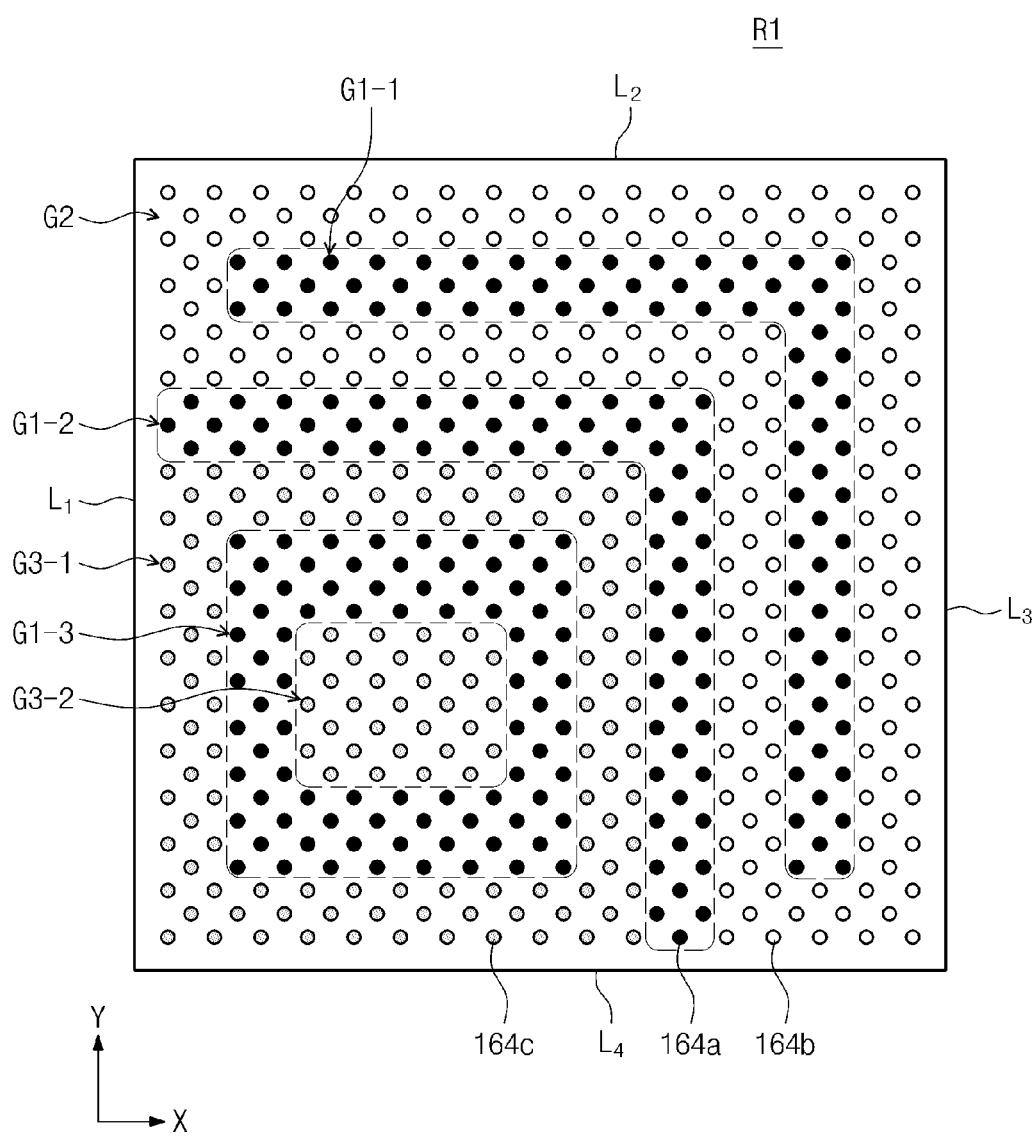

As another embodiment, as shown in FIG. 8B, except that third group structures G3-1 and G3-2 are divided into two structures by a first group structure G1-3 having a square ring shape, the arrangement of this embodiment may be identical to that of the first through third group structures G1, G2, and G3 described in FIG. 7B.

Figure 8C:
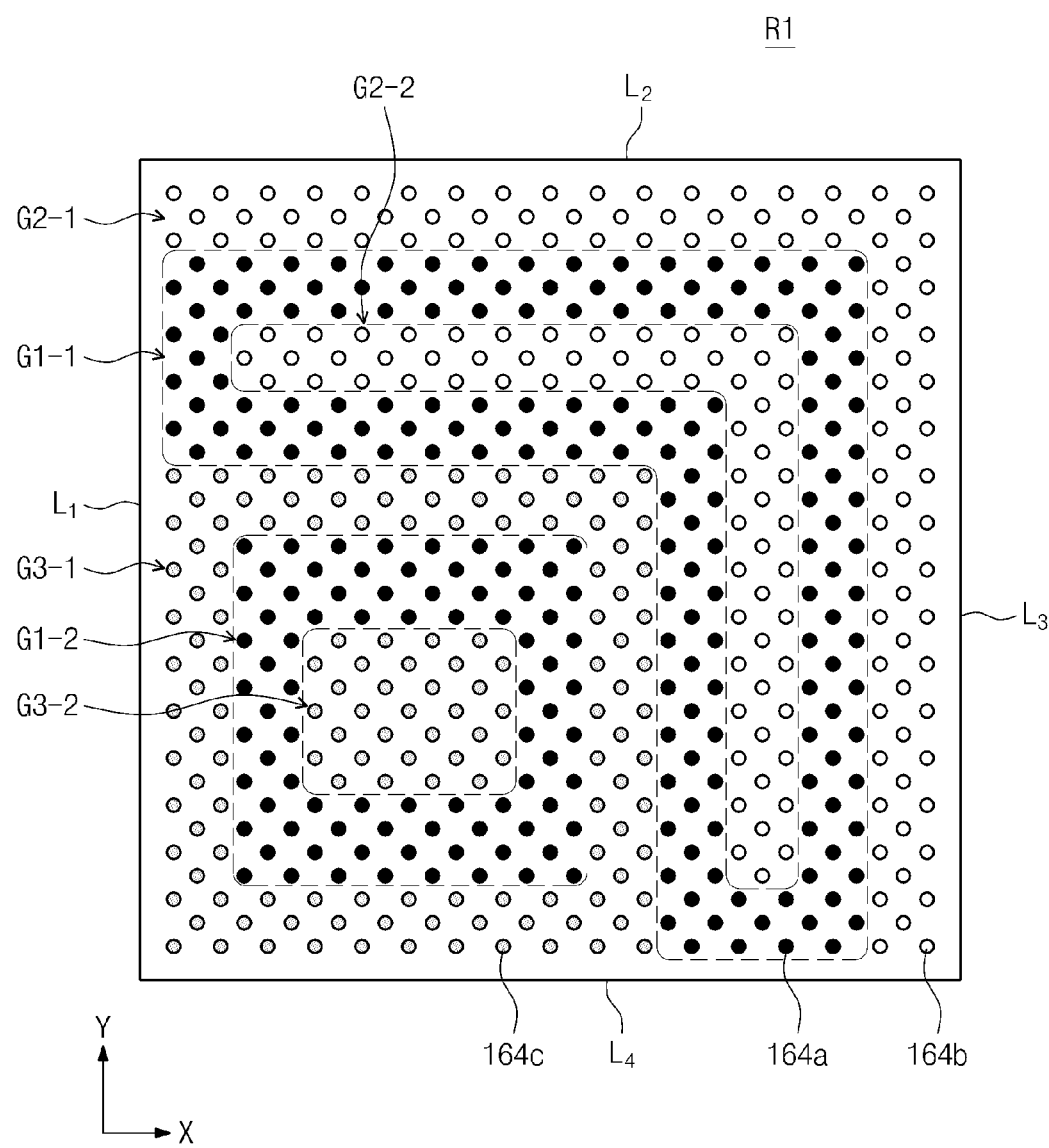

As another embodiment, as shown in FIG. 8C, except that third group structures G3-1 and G3-2 are divided into two structures by a first group structure G1-2 having a square ring shape, the arrangement of this embodiment may be identical to that of the first through third group structures G1, G2, and G3 described in FIGS. 6C and 7C.

Figure 8D:
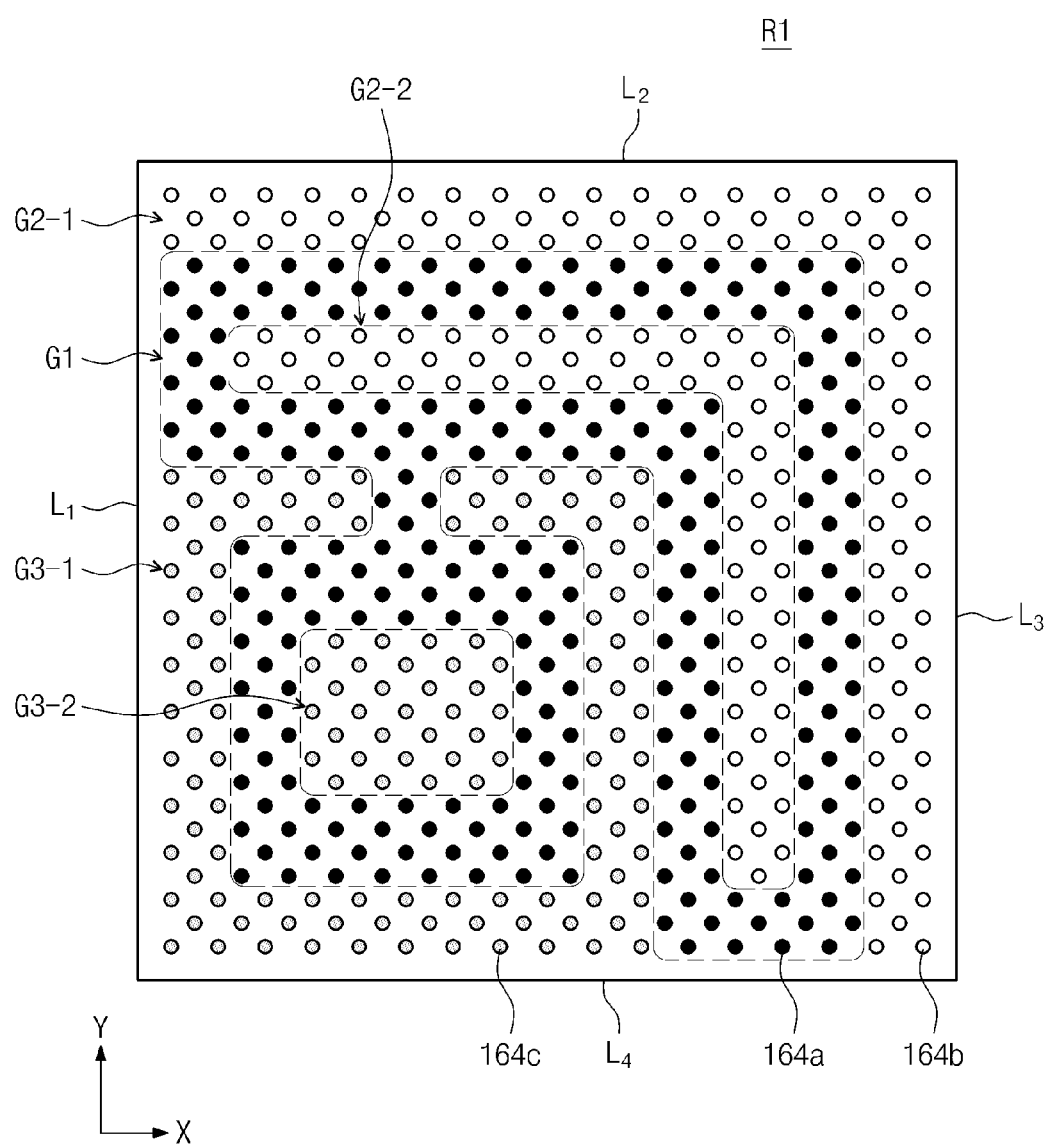

As another embodiment, as shown in FIG. 8D, third group structures G3-1 and G3-2 are divided into two structures by a first group structure G1 having a square ring shape. The first group structure G1 having a square ring shape in FIG. 7C may be connected to a first group structure G1 disposed to spatially separate second and third group structures G2-2 and G3-1 in a Y-axis direction to unify the first group structure G1.

Figure 8E:
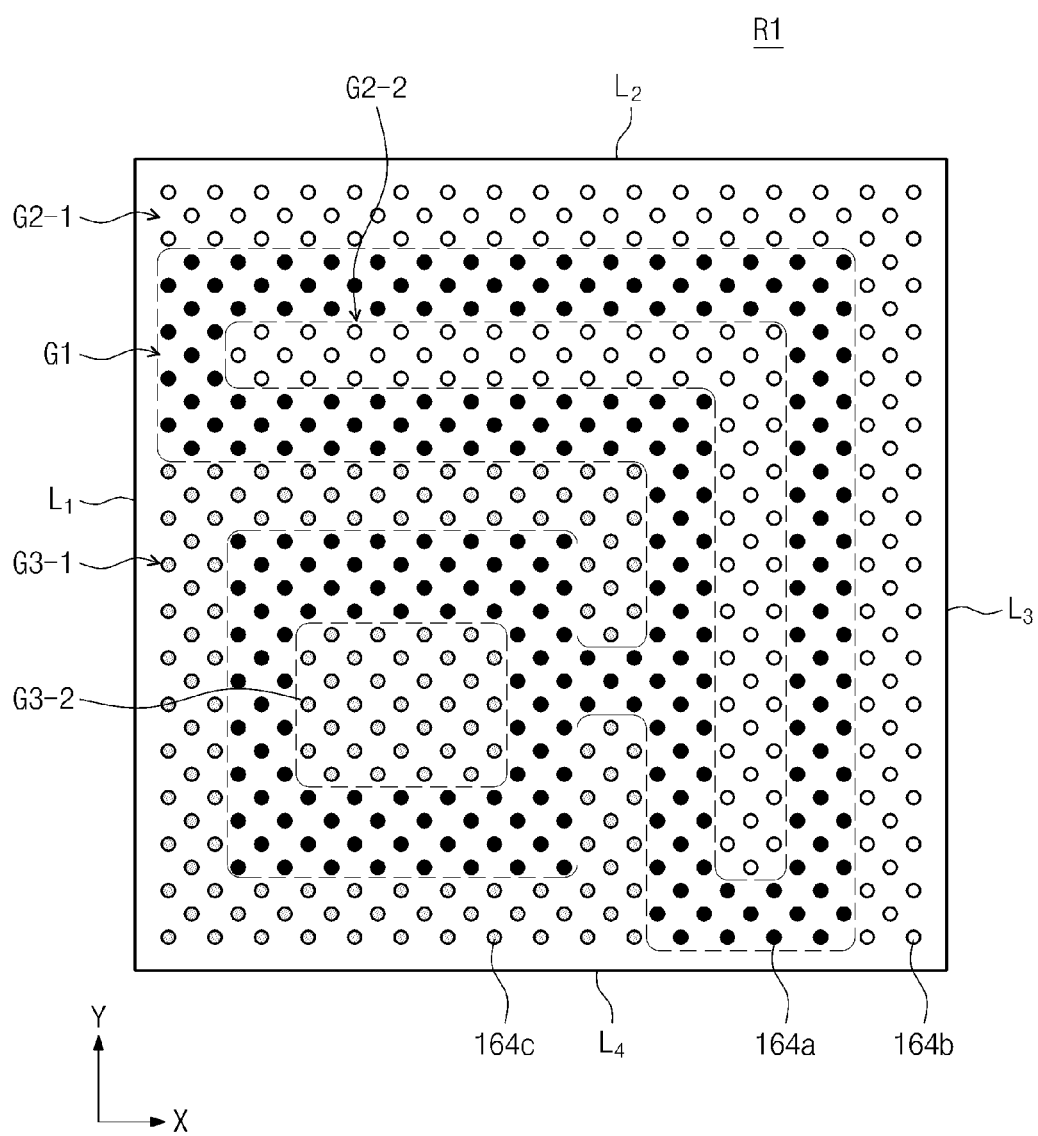

As another embodiment, as shown in FIG. 8E, this embodiment may have a similar configuration to that in FIG. 8D. However, the first group structure G1 having a square ring shape in FIG. 8C may be connected to a first group structure G1 disposed to spatially separate second and third group structures G2-2 and G3-1 in an X-axis direction to unify the first group structure G1.

Although the various modified embodiments have been described above, the arrangement configuration of a connection pattern according to the present disclosure is not limited to the foregoing embodiments.

Figure 9A:
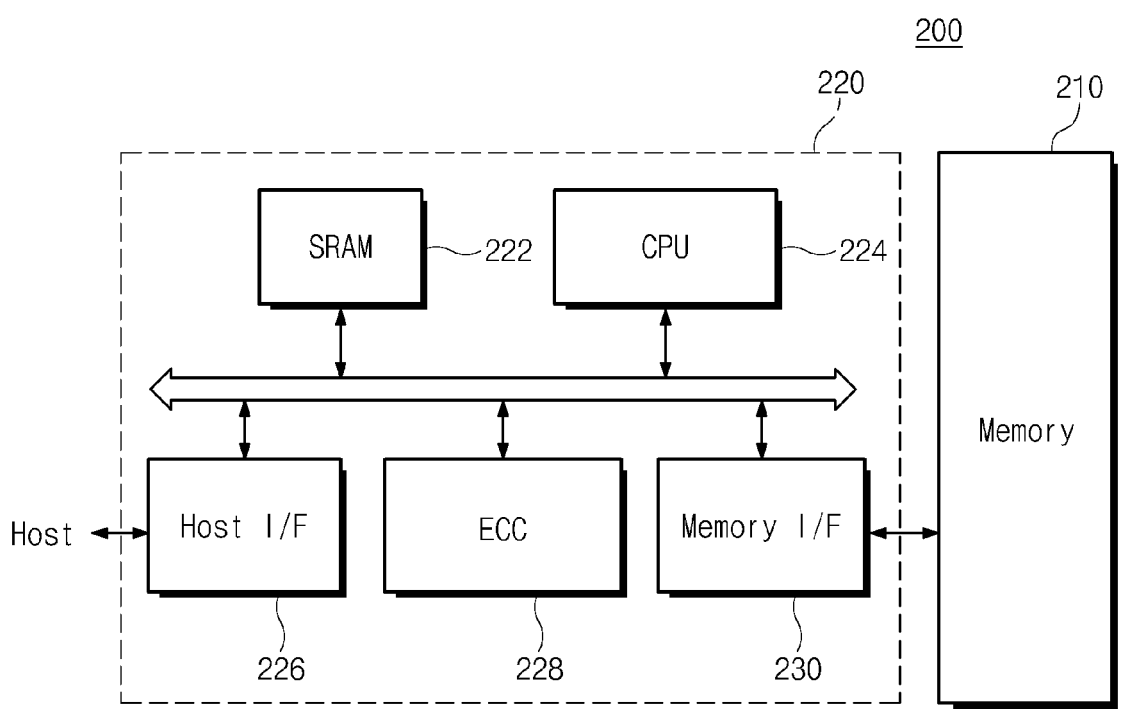
FIG. 9A is a block diagram of a memory card provided with a semiconductor package according to an exemplary embodiment.

FIG. 9A is a block diagram of a memory card provided with a semiconductor package according to an exemplary embodiment.

Referring to FIG. 9A, a semiconductor package according to one of the above-described embodiments may be applied to a memory card 200. As an example, the memory card 200 may include a memory controller 220 configured to control general data exchange between a host and a memory device 210. An SRAM 222 may be used as a working memory of a central processing unit (CPU) 224. A host interface (Host I/F) 226 may include a data exchange protocol of the host connected to the memory card 200. An error correction code block (ECC) 228 may detect and correct error included in data read out of a resistive memory 210. A memory interface (Memory I/F) 230 may interface with the resistive memory 210. The CPU 222 may execute an overall control operation for data exchange of the memory controller 220.

In one embodiment, the semiconductor memory 210 applied to the memory card 200 includes a semiconductor package manufactured according to an embodiment described above to improve electrical reliability of a capacitor embedded in a package substrate. Thus, electrical characteristics of a memory card including the semiconductor package may be improved.

Figure 9B:
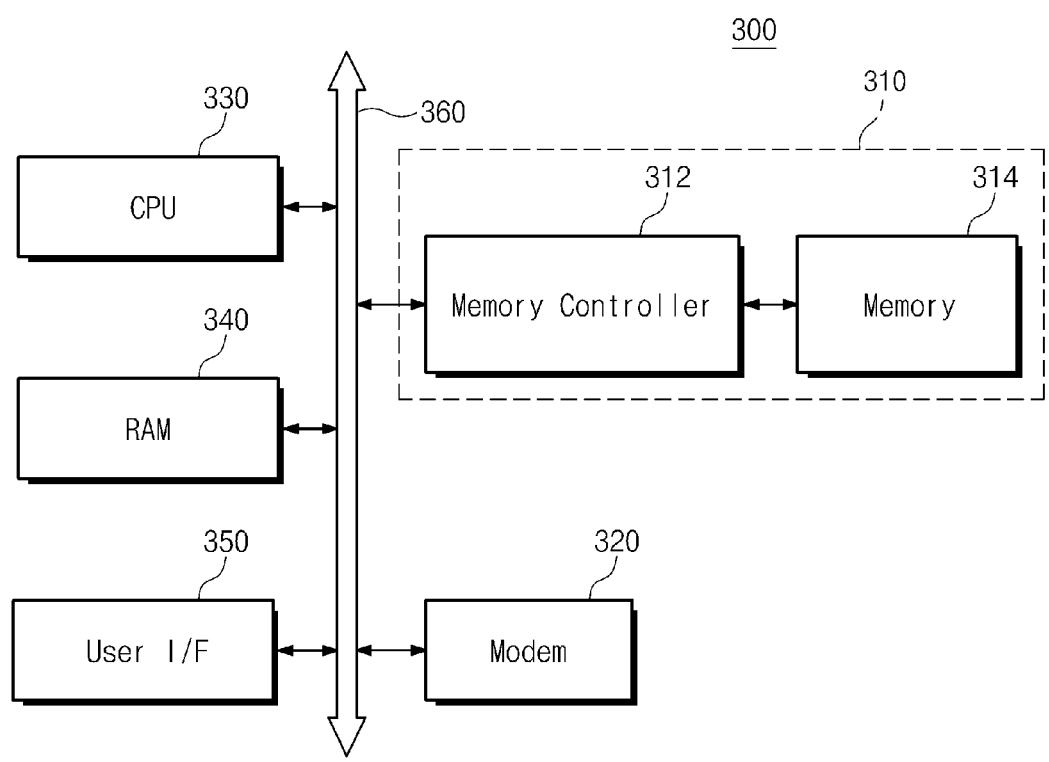
FIG. 9B is a block diagram of an information processing system to which a semiconductor package according to an exemplary embodiment is applied.

FIG. 9B is a block diagram of an information processing system to which a semiconductor package according to an exemplary embodiment is applied.

Referring to FIG. 9B, an information processing system 300 may include a memory system 310 provided with a semiconductor memory including a semiconductor package according to one of embodiments described above. The information processing system 300 may include a mobile device or a computer. For one example, the information processing system 300 may include a modem 320, a central processing unit (CPU) 330, random access memory (RAM) 340, and a user interface 350 which are electrically connected to a system bus 360, respectively. Data processed by the CPU 330 or external input data may be stored in the memory system 310. The flash memory system 310 may include a memory 312 and a memory controller 314 and may be organized with substantially the same structure as the memory card 200 described with reference to FIG. 9A. The data processing system 300 may be provided, for example, as a memory card, a solid state disk (SSD), a camera image sensor, and other application chipsets. For one example, the memory system 310 may be configured with an SSD. In this case, the information processing system 300 may stably and reliably store huge amounts of data in the memory system 310.

Figure 10:
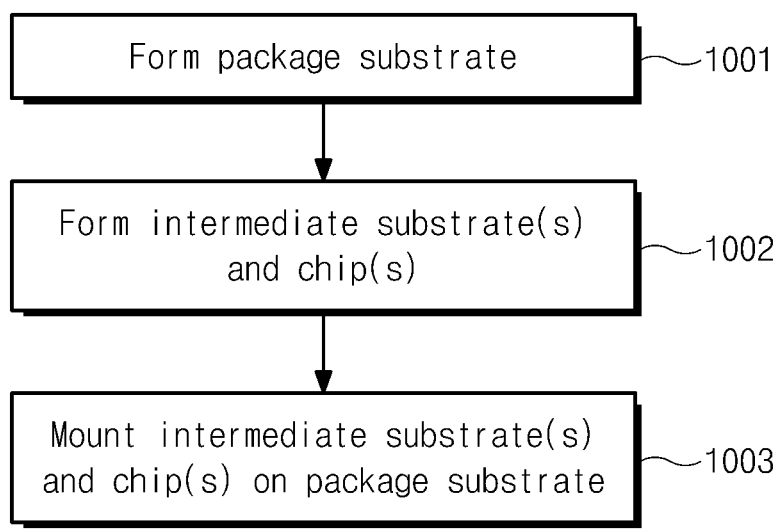
FIG. 10 shows a flow chart of an exemplary method of manufacturing a semiconductor package, according to one exemplary embodiment.

FIG. 10 shows a flow chart of an exemplary method of manufacturing a semiconductor package such as shown in FIG. 1A, according to one exemplary embodiment.

In step 1001, a package substrate is formed. The package substrate may include, for example, one or more embedded capacitors connected to or more conductive portions, such as the wirings shown in the above embodiments. The package substrate may also include a plurality of via contacts connected to the one or more conductive portions.

In step 1002, one or more chips are formed on one or more intermediate substrates. For example, a chip 104 as shown in FIG. 1A may be formed and electrically connected to an intermediate substrate 102. Steps 1001 and 1002 may occur in any order or at the same time.

In step 1003, the one or more chips and one or more intermediate substrates are mounted on the package substrate, and are electrically and physically connected to the package substrate using a connection structure, such as a plurality of connection terminals. The connection terminals may each connect to a respective via contact to electrically connect to the wiring in the package substrate. The connection terminals may comprise, for example, solder balls or bumps, that are connected to a bottom-most intermediate substrate and the package substrate through a soldering process. They may be first disposed to the intermediate substrate, which is then mounted on the package substrate, followed by a soldering process, or they may be first disposed on the package substrate, the intermediate substrate then mounted on the package substrate, and then a soldering process is performed. Other orders or ways of connecting the connection structures to the two substrates may be used.

According to embodiments described above, first connection patterns constitute a first group structure and second connection patterns constitute a second group structure. Thus, a predetermined voltage can be more efficiently applied to electrodes of a capacitor embedded in a package substrate. In addition, the first and second connection patterns are connected to electrodes of capacitors via a plurality of first and second via contacts, and thus, it is possible to establish stable electric pathways. As a result, electrical characteristics of a semiconductor package can be improved.

While the present disclosure has been particularly shown and described with reference to exemplary embodiments thereof, it will be apparent to those of ordinary skill in the art that various changes in form and detail may be made therein without departing from the spirit and scope of the inventive concept as defined by the following claims.

What is claimed is:

1. A semiconductor package comprising:
    a package substrate, including:
        a first wiring embedded in the package substrate;
        a second wiring embedded in the package substrate, the second wiring electrically insulated from the first wiring;
        a capacitor embedded in the package substrate, the capacitor including a first electrode electrically connected to the first wiring and a second electrode electrically connected to the second wiring;
    at least a first semiconductor chip disposed on the package substrate;
    a plurality of connection terminals disposed between the package substrate and the first semiconductor chip and contacting the package substrate, the plurality of connection terminals forming at least a first group of at least two connection terminals formed continuously adjacent to each other and at least a second group of at least two connection terminals formed continuously adjacent to each other,
    wherein the first group of at least two connection terminals is electrically connected to the first wiring and the second group of at least two connection terminals is electrically connected to the second wiring.

2. The semiconductor package of claim 1, further comprising:
    a first group of at least two via contacts that contact the at least two connection terminals of the first group respectively, and disposed between the at least two connection terminals and the wiring.

3. The semiconductor package of claim 1, wherein:
    the first wiring and second wiring are disposed above the first electrode and the second electrode of the capacitor;
    a top of the first wiring is below a top surface of the package substrate, and
    a bottom of the capacitor is above a bottom surface of the package substrate.

4. The semiconductor package of claim 1, wherein:
    the first wiring, first electrode, and first group of at least two connection terminals are electrically connected to a first voltage source; and
    the second wiring, second electrode, and second group of at least two connection terminals are electrically connected to a second voltage source.

5. The semiconductor package of claim 4, wherein:
    the first voltage source supplies a ground voltage; and
    the second voltage source supplies a power supply voltage.

6. The semiconductor package of claim 5, wherein:
    the plurality of connection terminals includes a third group of two or more connection terminals, and
    the third group of two or more connection terminals is electrically connected to a third voltage source.

7. The semiconductor package of claim 6, wherein:
    the third voltage source is the same voltage source as the first voltage source.

8. The semiconductor package of claim 1, wherein:
    the first semiconductor chip has a rectangular shape and is disposed in a first region defined by its four edges, the first region thereby having four sides that coincide with the four edges;
    the first group of at least two connection terminals comprises a first group structure that is inside the first region and adjacent at least a first side of the first region; and
    the second group of at least two connection terminals comprises a second group structure that is inside the first region and adjacent the first group of at least two connection terminals, such that at least part of the first group structure is between the second group structure and the first side of the first region.

9. The semiconductor package of claim 8, wherein:
    the first group structure includes connection terminals extending from a second side of the first region to a third side of the first region and adjacent to the first side of the first region.

10. The semiconductor package of claim 9, wherein:
    the first group structure includes connection terminals that surround the second group structure.

11. The semiconductor package of claim 8, wherein:
    the first group structure includes at least four connection terminals, each connection terminal adjacent to at least one connection terminal of the first group structure in a first direction and also adjacent to at least a second connection terminal of the first group structure in a second direction not parallel to the first direction; and
    the second group structure includes at least four connection terminals, each connection terminal adjacent to at least one connection terminal of the second group structure in a third direction and also adjacent to at least a second connection terminal of the second group structure in a fourth direction not parallel to the third direction.

12. The semiconductor package of claim 8, wherein:
    at least one sub-group of the first group structure includes a connection terminal of the first group structure surrounded by four other connection terminals of the first group structure; and
    at least one sub-group of the second group structure includes a connection terminal of the second group structure surrounded by four other connection terminals of the second group structure.

13. The semiconductor package of claim 1, further comprising:
    an intermediate substrate between the first chip and the package substrate, and in contact with the plurality of connection terminals,
    wherein the connection terminals are conductive bumps or balls.

14. A semiconductor package comprising:
    a package substrate, including:
        a first wiring electrically connected to a first voltage source;
        a second wiring electrically connected to a second voltage source, the second wiring electrically insulated from the first wiring;

a capacitor including a first electrode electrically connected to the first wiring and a second electrode electrically connected to the second wiring;

at least a first semiconductor chip disposed on the package substrate;

a plurality of connection terminals disposed between the package substrate and the first semiconductor chip and contacting the package substrate, the plurality of connection terminals forming at least a first group of a plurality of connection terminals formed continuously adjacent to each other to form a first group structure, and at least a second group of a plurality of connection terminals formed continuously adjacent to each other to form a second group structure, wherein the first group structure is electrically connected to the first wiring and first voltage source, and the second group structure is electrically connected to the second wiring and second voltage source, wherein the first group structure includes at least four connection terminals, each connection terminal adjacent to at least one connection terminal of the first group structure in a first direction and also adjacent to at least a second connection terminal of the first group structure in a second direction not parallel to the first direction, and wherein the second group structure includes at least four connection terminals, each connection terminal adjacent to at least one connection terminal of the second group structure in a third direction and also adjacent to at least a second connection terminal of the second group structure in a fourth direction not parallel to the third direction.

15. The semiconductor package of claim 14, wherein:

at least one sub-group of the first group structure includes a connection terminal of the first group structure surrounded by four other connection terminals of the first group structure; and at least one sub-group of the second group structure includes a connection terminal of the second group structure surrounded by four other connection terminals of the second group structure.

16. The semiconductor package of claim 14, wherein:

the first wiring, second wiring, and capacitor are embedded in the package substrate.

17. The semiconductor package of claim 16, wherein:

the first wiring is physically separated from the plurality of connection terminals of the first group structure and is electrically connected to the connection terminals of the first group structure by a plurality of first respective via contacts; and the second wiring is physically separated from the plurality of connection terminals of the second group structure and is electrically connected to the connection terminals of the second group structure by a plurality of second respective via contacts.

18. The semiconductor device of claim 17, wherein:

the first voltage source is a ground voltage source; and the second voltage source is a power supply voltage source.

19. The semiconductor device of claim 17, wherein:

the first wiring, first electrode, first group structure, and first via contacts comprise a first node electrically connected to the first voltage source; and the second wiring, second electrode, second group structure, and second via contacts comprise a second node electrically connected to the second voltage source.

20. A semiconductor package comprising:

a package substrate, including:

a first node electrically connected to a first voltage source, the first node including:

a first wiring, a first electrode of a capacitor electrically connected to the first wiring, a plurality of first via contacts electrically connected to the first wiring, and a plurality of first connection terminals electrically connected to the plurality of first via contacts, the plurality of first connection terminals physically separated from each other but respectively physically connected to the plurality of first via contacts;

a second node electrically connected to a second voltage source, the second node including:

a second wiring, a second electrode of a capacitor electrically connected to the second wiring, a plurality of second via contacts electrically connected to the second wiring, and a plurality of second connection terminals electrically connected to the plurality of second via contacts, the plurality of second connection terminals physically separated from each other but respectively physically connected to the plurality of second via contacts, wherein the first node and the second node are electrically insulated from each other; and at least a first semiconductor chip disposed on the package substrate, and electrically connected to the package substrate through the plurality of first connection terminals and the plurality of second connection terminals.

* * * * *